(12) United States Patent
Saitoh

(10) Patent No.: US 7,403,403 B2
(45) Date of Patent: Jul. 22, 2008

(54) NOISE SUPPRESSOR

(75) Inventor: Yoshihiro Saitoh, Tokyo (JP)

(73) Assignee: TDK Corporation, Tokyo (JP)

( * ) Notice: Subject to any disclaimer, the term of this patent is extended or adjusted under 35 U.S.C. 154(b) by 155 days.

(21) Appl. No.: 11/376,317

(22) Filed: Mar. 16, 2006

(65) Prior Publication Data

US 2006/0220972 A1    Oct. 5, 2006

(30) Foreign Application Priority Data

Mar. 31, 2005    (JP) .............................. 2005-102470

(51) Int. Cl.
*H02M 5/40*    (2006.01)

(52) U.S. Cl. ............................ 363/34; 363/37; 361/118; 333/181

(58) Field of Classification Search ............. 363/34–41, 363/105, 47, 65, 67; 323/206, 309, 299, 323/328; 307/105, 407, 89; 336/65, 83, 336/175; 333/168, 177, 181, 132; 361/118

See application file for complete search history.

(56) References Cited

U.S. PATENT DOCUMENTS 6,339,265 B1 * 1/2002 Levin et al. ................. 307/407
7,193,869 B2 * 3/2007 Suzuki ........................ 363/39

OTHER PUBLICATIONS

"Transistor Gijutsu Special No. 44"; CQ Publishing Co., Ltd., issued on Mar. 1, 1994, pp. 5-6.

* cited by examiner

*Primary Examiner*—Rajnikant B Patel
(74) *Attorney, Agent, or Firm*—Oliff & Berridge, PLC

(57) ABSTRACT

A noise suppressor capable of preventing degradation in an attenuation characteristic by a parasitic component so as to obtain a favorable attenuation characteristic is provided. The noise suppressor includes a first winding wire disposed on a first current-carrying wire and a series circuit including a capacitor and a second winding wire which are connected to each other in series. The first winding wire and the second winding wire are magnetically coupled to each other. The inductance xL of the whole second winding wire is smaller than the inductance LL of the whole first winding wire (xL<LL). Moreover, it is desirable that the inductance xL of the whole second winding wire is equal to or smaller than the inductance LL1 per turn in the first winding wire (xL≦LL1).

9 Claims, 15 Drawing Sheets

NOISE SUPPRESSOR

BACKGROUND OF THE INVENTION

1. Field of the Invention

The present invention relates to a noise suppressor which suppresses noise transmitted through a first current-carrying wire and a second current-carrying wire.

2. Description of the Related Art

Power electronics devices such as switching power supplies, inverters, lighting circuits for lighting fixtures include a power converter circuit which converts power. The power converter circuit includes a switching circuit which converts a direct current into an alternating current with a rectangular wave. Therefore, the power converter circuit produces a ripple voltage with a frequency equivalent to the switching frequency of the switching circuit or noise associated with the switching operation of the switching circuit. The ripple voltage or noise adversely affects other devices. Therefore, it is necessary to arrange a means for reducing the ripple voltage or noise between the power converter circuit and the other devices or lines.

Moreover, recently as a communications technology used for the establishment of a home communication network, power line communications holds promise, and the development of the power line communications has been advanced. In the power line communications, a high frequency signal is superimposed on a power line to establish communication. In the power line communications, noise is produced on the power line by the operations of various electrical and electronic devices connected to the power line, and the noise causes a decline in communication quality such as an increase in error rate. Therefore, a means for reducing noise on the power line is necessary. Moreover, in the power line communications, it is necessary to prevent a communication signal on an indoor power line from being leaked to an outdoor power line.

Noise transmitted through two current-carrying wires includes normal mode (differential mode) noise which causes a potential difference between two current-carrying wires and common mode noise transmitted through two current-carrying wires at the same phase.

Arranging a line filter on a power supply line, a signal line or the like is effective in preventing the noise. As the line filter, a filter including an inductance device (inductor) and a capacitor, that is, a so-called LC filter is commonly used.

FIG. 20 shows an example of a LC filter for normal mode noise prevention in a related art. The LC filter includes a first inductor L101 disposed on a first current-carrying wire 103 and a first capacitor C101 having one end connected to the first current-carrying wire 103 and the other end connected to a second current-carrying wire 104.

FIG. 21 shows an example of a LC filter for common mode noise prevention in a related art. The LC filter includes a first inductor L101 disposed on a first current-carrying wire 103 and a first capacitor C101 having one end connected to the first current-carrying wire 103 and the other end connected to ground. The LC filter further includes a second inductor L102 disposed on a second current-carrying wire 104 and a second capacitor C102 having one end connected to the second current-carrying wire 104 and the other end connected to ground. The first inductor L101 includes a first winding wire 111, and the second inductor L102 includes a second winding wire 112. The first and the second winding wires 111 and 112 are magnetically coupled to each other through winding the first and the second winding wires 111 and 112 around a common core 100 so as to prevent common mode noise in cooperation, thereby the first and the second winding wires 111 and 112 form a common mode choke coil.

The basic structure of such a LC filter is shown in "Transistor Gijutsu SPECIAL No. 44", CQ Publishing Co., Ltd., issued on Mar. 1, 1994, p 5 (FIG. 6).

SUMMARY OF THE INVENTION

In these noise filter circuits, in reality, a parasitic component is formed in each circuit device. FIG. 22 shows an equivalent circuit in the case where a parasitic component in the LC filter shown in FIG. 20 is taken into account. FIG. 23 shows an equivalent circuit in the case where a parasitic component in the LC filter shown in FIG. 21 is taken into account. As shown in the drawings, a parasitic capacitor C110 exists in parallel with a first inductor L101, and a parasitic capacitor C120 exists in parallel with a second inductor L102. Moreover, a parasitic inductor L110 exists in series with a first capacitor C101, and a parasitic inductor L120 exists in series with a second capacitor C102. In an actual circuit, such a parasitic component exists, so in each circuit device, a self-resonant point (a self-resonant frequency) by the device itself and the parasitic component exists.

For example, in the circuit shown in FIG. 22, the first inductor L101 and the parasitic capacitor C110 forms a parallel resonant circuit, thereby a self-resonant point is produced. The self-resonant point is a limit value at which the first inductor L101 functions as an inductor. The first inductor L101 functions not as an inductor but as a capacitor at a frequency equal to or higher than the self-resonant point. In this case, even if the first inductor L101 is combined with the first capacitor C110 to form the LC filter, a through path is produced by the parasitic capacitor C110. Therefore, high-pass performance is not improved in a band equal to or higher than the self-resonant point, so it is difficult to obtain desired characteristics. In a typical LC filter, the inductance of an inductor disposed on a line is large, so in coil manufacturing, a parasitic capacitor of approximately a few pF is added spontaneously. In this case, as the value of inductance is large, the self-resonant point is at a low frequency. In other words, the typical LC filter has a self-resonant point at a low frequency, so it adversely affects high-pass performance at a self-resonant frequency or higher.

Therefore, it is considered that if the self-resonant point of the inductor on a line can be moved to a higher frequency side, the high-pass performance can be improved. For example, through selecting a core material or devising a winding method, the LC filter can be improved to some extent so as to make the parasitic capacitor smaller and to move the self-resonant point to a higher frequency side. However, in this case, when magnetic permeability $\mu$ of the core material is increased in order to increase the inductance, the frequency characteristics of the inductor have to be reduced. Moreover, there are a number of trade-off limits such as needing to increase a space between windings or a space between a core and a line material in order to maintain a predetermined state for the purpose of increasing the number of turns or improving the frequency characteristics, so there is an issue that it is difficult to move the self-resonant point to a higher frequency side while securing the same inductance value. For example, in reality, it is very difficult to move the self-resonant point to the side of approximately twice as high frequency.

In view of the foregoing, it is desirable to provide a noise suppressor capable of obtaining a favorable attenuation characteristic through preventing degradation in the attenuation characteristic by a parasitic component.

According to a first embodiment of the invention, there is provided a noise suppressor suppressing noise transmitted through a first current-carrying wire and a second current-carrying wire, the noise suppressor including: a first winding wire being disposed on the first current-carrying wire; and a series circuit including a capacitor and a second winding wire which are connected to each other in series, the series circuit having one end connected to the first current-carrying wire and the other end connected to the second current-carrying wire. In the noise suppressor, the first winding wire and the second winding wire are magnetically coupled to each other, and the inductance of the whole second winding wire is set to be smaller than the inductance of the whole first winding wire. Moreover, the first winding wire and the a parasitic capacitor of the first winding wire equivalently form a parallel resonant circuit, and the second winding wire and the capacitor in the series circuit and a parasitic inductor of the capacitor equivalently form a series resonant circuit. Further, fh>f is satisfied, where the coupling coefficient between the first winding wire and the second winding wire is k1, the resonant frequency by the capacitor and the parasitic inductor in the series resonant circuit in the case of k1=0 is fh, and the resonant frequency of the parallel resonant circuit in the case of k1=0 is f, and fhm≧fm is satisfied, where the resonant frequency of the whole series resonant circuit in the case where the first winding wire and the second winding wire are magnetically coupled to each other is fhm, and the resonant frequency of the parallel resonant circuit in the case where the first winding wire and the second winding wire are magnetically coupled to each other is fm.

In addition, magnetic coupling between the first winding wire and the second winding wire is preferably strong. In other words, when the coupling coefficient between the first winding wire and the second winding wire is k1, it is preferable that k1≈1 is ideally established.

In the noise suppressor according to the first embodiment of the invention, a circuit for normal mode noise prevention which is an improved versiton of a LC type filter circuit in a related art is formed. In the noise suppressor, the second winding wire is magnetically coupled to the first winding wire, and the inductance of the second winding wire or the resonant frequency of a predetermined circuit portion is set to satisfy an appropriate condition, so even if a parasitic capacitor is formed in the first winding wire on the current-carrying wire, thereby a self-resonant point is produced, the self-resonant point can be moved to a higher frequency side. Thereby, the influence of the parasitic capacitor is equivalently reduced, and a favorable attenuation characteristic can be obtained.

In particular, when magnetic coupling between the first winding wire and the second wire is strong, the attenuation characteristic can be kept more favorable in a higher frequency side than the moved self-resonant point.

Herein, in the noise suppressor according to the first embodiment of the invention, the inductance of the whole second winding wire is preferably equal to or smaller than the inductance per turn in the first winding wire.

When such a condition is satisfied, a more favorable attenuation characteristic can be obtained.

Moreover, the noise suppressor according to the first embodiment of the invention may further include a core around which the first winding wire and the second winding wire are commonly wound, and the first winding wire and the second winding wire may be magnetically coupled directly to each other via the common core.

In this case, as the first winding wire and the second winding wire are magnetically coupled to each other via the common core, each winding wire can be magnetically coupled to the other winding wire through the use of a simple structure, and size reduction can be easily made.

According to a second embodiment of the invention, there is provided a noise suppressor suppressing noise transmitted through a first current-carrying wire and a second current-carrying wire, the noise suppressor including: a first winding wire being disposed on the first current-carrying wire; a series circuit including a capacitor and a second winding wire which are connected to each other in series, the series circuit having one end connected to the first current-carrying wire and the other end connected to the second current-carrying wire; a first core around which the first winding wire is wound; a first coupling winding wire wound on a secondary side of the first core; a second core around which the second winding wire is wound on a secondary side; and a second coupling winding wire which is connected to the first coupling winding wire and is round on a primary side of the second core. In the noise suppressor, the first winding wire and the second winding wire are magnetically coupled to each other via the first and the second winding wires for coupling equivalently, and the inductance of the whole second winding wire is set to be smaller than the inductance of the whole first winding wire, and the first winding wire and a parasitic capacitor of the first winding wire equivalently form a parallel resonant circuit, and the second winding wire and the capacitor in the series circuit and a parasitic inductor of the capacitor equivalently form a series resonant circuit. Moreover, fh>f is satisfied, where the coupling coefficient between the first winding wire and the second winding wire is k1, the resonant frequency by the capacitor and the parasitic inductor in the series resonant circuit in the case of k1=0 is fh, and the resonant frequency of the parallel resonant circuit in the case of k1=0 is f, and fhm≧fm is satisfied, where the resonant frequency of the whole series resonant circuit in the case where the first winding wire and the second winding wire are magnetically coupled to each other is fhm, and the resonant frequency of the parallel resonant circuit in the case where the first winding wire and the second winding wire are magnetically coupled to each other is fm.

In addition, magnetic coupling between the first winding wire and the second winding wire is preferably strong. In other words, when the coupling coefficient between the first winding wire and the second winding wire is k1, it is preferable that k1≈1 is ideally established.

In the noise suppressor according to the second embodiment, a circuit for normal mode noise prevention which is an improved version of the LC type filter circuit in the related art is formed. In the noise suppressor, the second winding wire is magnetically coupled to the first winding wire via two cores equivalently, and the inductance of the second winding wire or the resonant frequency of a predetermined circuit portion is set to satisfy an appropriate condition, so even if a parasitic capacitor is formed in the first winding wire on the current-carrying wire, thereby a self-resonant point is produced, the self-resonant point can be moved to a higher frequency side. Thereby, the influence of the parasitic capacitor is equivalently reduced, and a favorable attenuation characteristic can be obtained.

In particular, when magnetic coupling between the first winding wire and the second wire is strong, the attenuation characteristic can be kept more favorable in a higher frequency side than the moved self-resonant point.

Herein, in the noise suppressor according to the second embodiment of the invention, the inductance of the whole second winding wire is preferably equal to or smaller than the inductance per turn in the first winding wire.

When such a condition is satisfied, a more favorable attenuation characteristic can be obtained. In the noise suppressor according to the second embodiment of the invention, the second winding wire is magnetically coupled to the first winding wire through the use of two cores equivalently, so while magnetic coupling between the first winding wire and the second winding wire is kept strong, a circuit which can easily satisfy such an inductance condition can be achieved.

In order to satisfy such an inductance condition, it is preferable that the following condition is further satisfied. That is, $\mu1>\mu2$ is preferably satisfied, where the magnetic permeability of the first core is $\mu1$, and the magnetic permeability of the second core is $\mu2$.

Thereby, while magnetic coupling between the first winding wire and the second winding wire is kept strong, the inductance of the whole second winding wire can be easily reduced. For example, when the magnetic permeability $\mu1$ of the first core and the magnetic permeability $\mu2$ of the second core are set so as to satisfy an appropriate condition, the inductance of the whole second winding wire can be easily reduced to be smaller than the inductance per turn in the first winding wire.

According to a third embodiment of the invention, there is provided a noise suppressor suppressing noise transmitted through a first current-carrying wire and a second current-carrying wire, the noise suppressor including: a first winding wire being disposed on the first current-carrying wire; a first series circuit including a first capacitor and a second winding wire which are connected to each other in series, the first series circuit having one end connected to the first current-carrying wire and the other end connected to ground; a third winding wire being disposed on the second current-carrying wire, and being magnetically coupled to the first winding wire; and a second series circuit including a second capacitor and a fourth winding wire which are connected to each other in series, the second series circuit having one end connected to the second current-carrying wire and the other end connected to ground. In the noise suppressor, the first winding wire and the second winding wire are magnetically coupled to each other, and the third winding wire and the fourth winding wire are magnetically coupled to each other, and the inductance of the whole second winding wire is set to be smaller than the inductance of the whole first winding wire, and the inductance of the whole fourth winding wire is set to be smaller than the inductance of the whole third winding wire. Moreover, the first winding wire and a parasitic capacitor of the first winding wire equivalently form a first parallel resonant circuit, and the second winding wire, the first capacitor and a parasitic inductor of the first capacitor equivalently form a first series resonant circuit, and the third winding wire and a parasitic capacitor of the third winding wire equivalently form a second parallel resonant circuit, and the fourth winding wire, the second capacitor and a parasitic inductor of the second capacitor equivalently form a second series resonant circuit. Further, fh>f is satisfied, where the coupling coefficient between the first winding wire and the second winding wire is k1, the coupling coefficient between the third winding wire and the fourth winding wire is k2, the resonant frequency by the first capacitor and the parasitic inductor in the first series resonant circuit in the case of k1, k2=0 is fh, the resonant frequency of the first parallel resonant circuit in the case of k1, k2=0 is f, the resonant frequency by the second capacitor and the parasitic inductor in the second resonant circuit in the case of k1, k2=0 is also fh, and the resonant frequency of the second parallel resonant circuit in the case of k1, k2=0 is also f, and fhm≧fm is satisfied, where the resonant frequency of the whole first series resonant circuit in the case where the first winding wire and the second winding wire are magnetically coupled to each other is fhm, the resonant frequency of the first parallel resonant circuit in the case where the first winding wire and the second winding wire are magnetically coupled to each other is fm, the resonant frequency of the whole second series resonant circuit in the case where the third winding wire and the fourth winding wire are magnetically coupled to each other is also fhm, and the resonant frequency of the second parallel resonant circuit in the case where the third winding wire and the fourth winding wire are magnetically coupled to each other is also fm.

In addition, magnetic coupling between the first winding wire and the second winding wire is preferably strong. In other words, when the coupling coefficient between the first winding wire and the second winding wire is k1, it is preferable that k1≈1 is ideally established. Moreover, magnetic coupling between the third winding wire and the fourth winding wire is preferably strong. In other words, when the coupling coefficient between the third winding wire and the fourth winding wire is k2, it is preferable that k2≈1 is ideally established.

In the noise suppressor according to the third embodiment of the invention, a circuit for common mode noise prevention which is an improved version of the LC type filter circuit in the related art is formed. In the noise suppressor, the second winding wire is magnetically coupled to the first winding wire, and the fourth winding wire is magnetically coupled to the third winding wire, and the inductance of the second winding wire, the inductance of the fourth winding wire and a resonant frequency are set to satisfy appropriate conditions, so even if a parasitic capacitor is formed in the first winding wire and the third winding wire on the current-carrying wires, thereby a self-resonant point is produced, the self-resonant point can be moved to a higher frequency side. Thereby, the influence of the parasitic capacitor is equivalently reduced, and a favorable attenuation characteristic can be obtained.

In particular, when magnetic coupling between the first winding wire and the second wire and magnetic coupling between the third winding wire and the fourth winding wire are strong, the attenuation characteristic can be kept more favorable in a higher frequency side than the moved self-resonant point.

Herein, in the noise suppressor according to the third embodiment of the invention, the inductance of the whole second winding wire is preferably equal to or smaller than the inductance per turn in the first winding wire, and the inductance of the whole fourth winding wire is preferably equal to or smaller than the inductance per turn in the third winding wire.

When such conditions are satisfied, a more favorable attenuation characteristic can be obtained.

Moreover, in the noise suppressor according to the third embodiment of the invention, it is preferable that one end of the first capacitor of the first series circuit is connected to the first current-carrying wire, and one end of the second capacitor of the second series circuit is connected to the second current-carrying wire, and the second winding wire of the first series circuit and the fourth winding wire of the second series circuit are combined to form a combined winding wire, and one end of the combined winding wire is connected to the other end of the first capacitor of the first series circuit and the other end of the second capacitor of the second series circuit, and the other end of the combined winding wire is connected to ground, and the combined winding wire is magnetically coupled to the first winding wire and the third winding wire.

In this case, the second winding wire and the fourth winding wire are combined, so compared to the case where the second winding wire and the fourth winding wire are separately disposed, a simple structure can be achieved, and size reduction can be easily made.

In this case, a core around which the combined winding wire, the first winding wire and the third winding wire are commonly wound may be included, and the winding wires may be magnetically coupled directly to one another via the common core.

In this case, each winding wire can be magnetically coupled to the other winding wire through the use of a simple structure, and size reduction can be easily made.

According to a fourth embodiment of the invention, there is provided a noise suppressor suppressing noise transmitted through a first current-carrying wire and a second current-carrying wire, the noise suppressor including: a first winding wire being disposed on the first current-carrying wire; a first capacitor having one end connected to the first current-carrying wire; a second winding wire having one end connected to the other end of the first capacitor, and the other end connected to ground, the second winding wire forming a first series circuit together with the first capacitor; a third winding wire being disposed on the second current-carrying wire, and being magnetically coupled to the first winding wire; a second capacitor having one end connected to the second current-carrying wire and the other end connected to one end of the second winding wire, the second capacitor forming a second series circuit together with the second winding wire; a first core around which the first winding wire and the third winding wire are commonly wound; a first coupling winding wire commonly wound around the first core together with the first winding wire and the third winding wire; a second core around which the second winding wire is wound on a secondary side; and a second coupling winding wire being connected to the first coupling winding wire, and being wound on a primary side of the second core. In the noise suppressor, the second winding wire, the first winding wire and the third winding wire are magnetically coupled to one another via the first and the second coupling winding wires equivalently, and the inductance of the whole second winding wire is set to be smaller than the inductance of the whole winding wire and the whole third winding wire. Moreover, the first winding wire and a parasitic capacitor of the first winding wire equivalently form a first parallel resonant circuit, and the second winding wire and the first capacitor which form the first series circuit, and a parasitic inductor of the first capacitor equivalently form a first series resonant circuit, the third winding wire and a parasitic capacitor of the third winding wire equivalently form a second parallel resonant circuit, and the second winding wire and the second capacitor which form the second series circuit, and a parasitic inductor of the second capacitor equivalently form a second series resonant circuit. Further, fh>f is satisfied, where the coupling coefficient between the first winding wire and the second winding wire is k1, the coupling coefficient between the third winding wire and the second winding wire is k2, the resonant frequency by the first capacitor and the parasitic inductor in the first series resonant circuit in the case of k1, k2=0 is fh, the resonant frequency of the first parallel resonant circuit in the case of k1, k2=0 is f, the resonant frequency by the second capacitor and the parasitic inductor in the second resonant circuit in the case of k1, k2=0 is also fh, and the resonant frequency of the second parallel resonant circuit in the case of k1, k2=0 is also f, and fhm≧fm is satisfied, where the resonant frequency of the whole first series resonant circuit in the case where the first winding wire and the second winding wire are magnetically coupled to each other is fhm, the resonant frequency of the first parallel resonant circuit in the case where the first winding wire and the second winding wire are magnetically coupled to each other is fm, the resonant frequency of the whole second series resonant circuit in the case where the third winding wire and the second winding wire are magnetically coupled to each other is also fhm, and the resonant frequency of the second parallel resonant circuit in the case where the third winding wire and the second winding wire are magnetically coupled to each other is also fm.

In addition, magnetic coupling between the first winding wire and the second winding wire is preferably strong. In other words, when the coupling coefficient between the first winding wire and the second winding wire is k1, it is preferable that k1≈1 is ideally established. Moreover, magnetic coupling between the third winding wire and the second winding wire is preferably strong. In other words, when the coupling coefficient between the third winding wire and the second winding wire is k2, it is preferable that k2≈1 is ideally established.

In the noise suppressor according to the fourth embodiment of the invention, a circuit for common mode noise prevention which is an improved version of the LC type filter circuit in the related art is formed. In the noise suppressor, the second winding wire is magnetically coupled to the first winding wire and the third winding wire through the use of two cores equivalently, and the inductance of the second winding wire or the resonant frequency of a predetermined circuit portion is set to satisfy an appropriate condition, so even if parasitic capacitor is formed in the first winding wire and the third winding wire on the current-carrying wires, thereby a self-resonant point is produced, the self-resonant point can be moved to a higher frequency side. Thereby, the influence of the parasitic capacitor is equivalently reduced, and a favorable attenuation characteristic can be obtained.

In particular, when magnetic coupling between the first and the second winding wires and magnetic coupling between the third and the second winding wires are strong, the attenuation characteristic can be kept more favorable in a higher frequency side than the moved self-resonant point.

Herein, in the noise suppressor according to the fourth embodiment of the invention, the inductance of the whole second winding wire is preferably equal to or smaller than the inductance per turn in the first winding wire and the inductance per turn in the third winding wire. When such a condition is satisfied, a more favorable attenuation characteristic can be obtained. In the noise suppressor according to the fourth embodiment of the invention, the second winding wire is magnetically coupled to the first winding wire and the third winding wire through the use of two cores equivalently, so while magnetic coupling between the first and the second winding wires and magnetic coupling between the third and the second winding wires are kept strong, a circuit which can easily satisfy such an inductance condition can be achieved.

In order to satisfy such an inductance condition, it is preferable that the following condition is further satisfied. That is, $\mu_1 > \mu_2$ is preferably satisfied, where the magnetic permeability of the first core is $\mu_1$, and the magnetic permeability of the second core is $\mu_2$.

Thereby, while magnetic coupling between the first and the third winding wires and the second winding wire is kept strong, the inductance of the whole second winding wire can be easily reduced. For example, when the magnetic permeability $\mu_1$ of the first core and the magnetic permeability $\mu_2$ of the second core are set so as to satisfy an appropriate condition, the inductance of the whole second winding wire can be easily reduced to be smaller than the inductance per turn in the first winding wire and the inductance per turn in the third winding wire.

In the noise suppressor according to the first embodiment of the invention, the second winding wire is magnetically coupled to the first winding wire disposed on the first current-carrying wire, and the inductance of the second winding wire and the resonant frequency of a predetermined circuit portion are set to satisfy an appropriate condition, so even if the parasitic capacitor is formed in the first winding wire on the current-carrying wire, thereby a self-resonant point is produced, the self-resonant point can be moved to a higher frequency side, and the influence of the parasitic capacitor can be equivalently reduced. Thereby, degradation in the attenuation characteristic by a parasitic component can be prevented so as to obtain a favorable attenuation characteristic.

In the noise suppressor according to the second embodiment of the invention, the second winding wire is magnetically coupled to the first winding wire disposed on the first current-carrying wire through the use of two cores equivalently, and the inductance of the second winding wire and the resonant frequency of a predetermined circuit portion are set to satisfy an appropriate condition, so even if a parasitic capacitor is formed in the first winding wire on the current-carrying wire, thereby a self-resonant point is produced, the self-resonant point can be moved to a higher frequency side, and the influence of the parasitic capacitor can be equivalently reduced. Thereby, degradation in the attenuation characteristic by a parasitic component can be prevented so as to obtain a favorable attenuation characteristic.

In the noise suppressor according to the third embodiment of the invention, the second winding wire is magnetically coupled to the first winding wire disposed on the first current-carrying wire, and the fourth winding wire is magnetically coupled to the third winding wire disposed on the second current-carrying wire, and the inductance of the second winding wire, the inductance of the fourth winding wire and the resonant frequency of a predetermined circuit portion are set to satisfy appropriate conditions, so even if a parasitic capacitor is formed in the first and the third winding wires on the current-carrying wires, thereby a self-resonant point is produced, the self-resonant point can be moved to a higher frequency side, and the influence of the parasitic capacitor can be equivalently reduced. Thereby, degradation in the attenuation characteristic by a parasitic component can be prevented so as to obtain a favorable attenuation characteristic.

In the noise suppressor according to the fourth embodiment of the invention, the second winding wire is magnetically coupled to the first winding wire disposed on the first current-carrying wire and the third winding wire disposed on the second current-carrying wire through the use of two cores equivalently, and the inductance of the second winding wire and the resonant frequency of a predetermined circuit portion are set to satisfy appropriate conditions, so even if a parasitic capacitor is formed in the first and the third winding wires on the current-carrying wires, thereby a self-resonant point is produced, the self-resonant point can be moved to a higher frequency side, and the influence of the parasitic capacitor can be equivalently reduced. Thereby, degradation in the attenuation characteristic by a parasitic component can be prevented so as to obtain a favorable attenuation characteristic.

Other and further objects, features and advantages of the invention will appear more fully from the following description.

BRIEF DESCRIPTION OF THE DRAWINGS

FIG. 13A shows a coupling circuit between winding wires and FIG. 13B shows an equivalent circuit of the coupling circuit shown in FIG. 13A;

DETAILED DESCRIPTION OF THE PREFERRED EMBODIMENTS

Preferred embodiments will be described in detail below referring to the accompanying drawings.

First Embodiment

Figure 1:
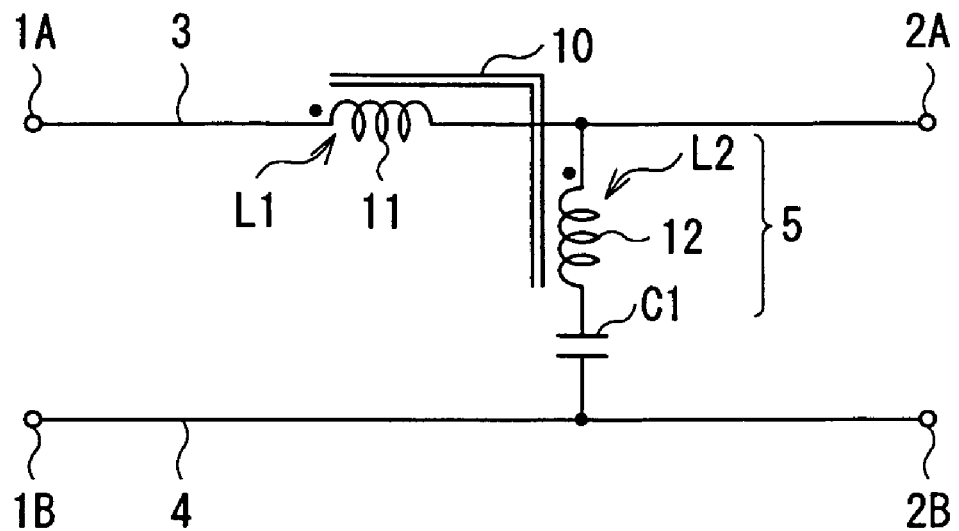
FIG. 1 is a circuit diagram showing a first example of a noise suppressor according to a first embodiment of the invention.

First, a noise suppressor according to a first embodiment of the invention will be described below. FIG. 1 shows an example of the noise suppressor according to the embodiment. The noise suppressor relates to a circuit for normal mode noise prevention.

The noise suppressor includes a pair of terminals 1A and 1B, another pair of terminals 2A and 2B, a first current-carrying wire 3 which establishes connection between the terminals 1A and 2A, and a second current-carrying wire 4 which establishes connection between the terminals 1B and 2B. The noise suppressor further includes a first winding wire 11 disposed on the first current-carrying wire 3, and a series circuit 5 having one end connected to the first current-carrying wire 3 and the other end connected to the second current-carrying wire 4. The series circuit 5 includes a capacitor C1 and a second winding wire 12 which are connected to each other in series. One end of the second winding wire 12 is connected to the first current-carrying wire 3, and the other end of the second winding wire 12 is connected to one end of the capacitor C1. The other end of the capacitor C1 is connected to the second current-carrying wire 4.

The noise suppressor further includes a core 10 around which the first and the second winding wires 11 and 12 are commonly wound, and the first winding wire 11 and the second winding wire 11 are magnetically coupled directly to each other via the common core 10. A first inductor L1 and a second inductor L2 are formed in each winding wire portion by the first and the second winding wires 11 and 12 and the core 10 around which the first and the second winding wires 11 and 12 are wound. Each inductor is formed by the same core 10, so they are magnetically coupled to each other. In the drawing, a black circle symbol shown in each winding wire indicates the polarity of the winding wire, that is, a winding direction. The polarities of the first and the second winding wires 11 and 12 are preferably in the same direction.

Figure 2:
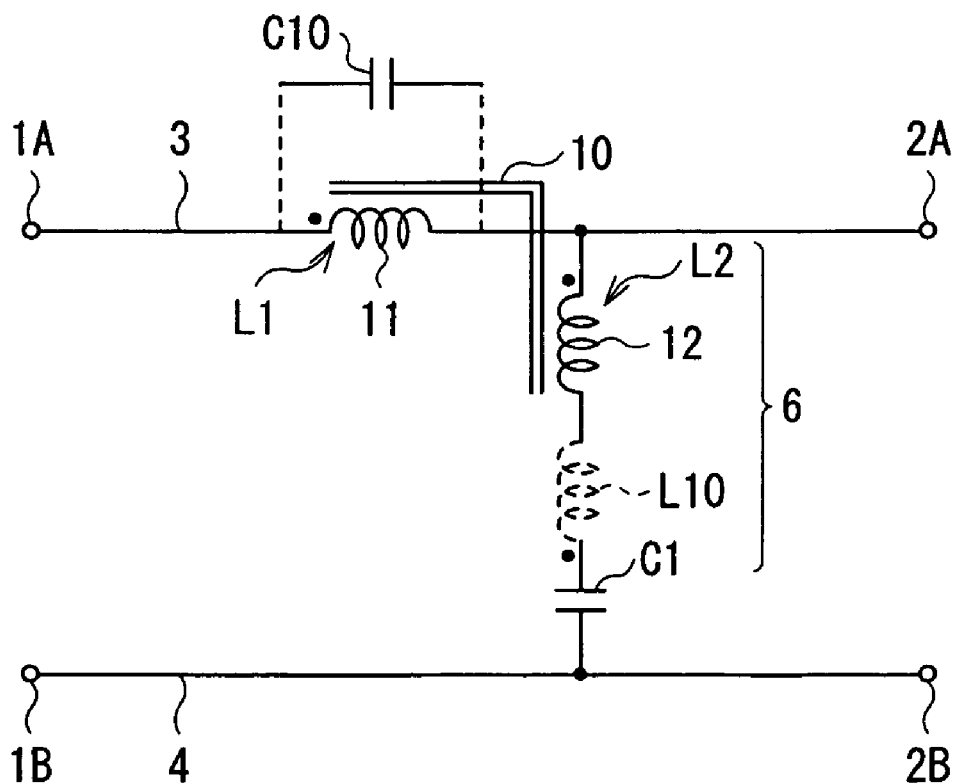
FIG. 2 is a circuit diagram showing an equivalent circuit in the case where a parasitic component in the noise suppressor shown in FIG. 1 is taken into account.

FIG. 2 shows an equivalent circuit in the case where a parasitic component in the noise suppressor is taken into account. As shown in the drawing, a parasitic capacitor C10 exists in parallel with the first winding wire 11, and a parasitic inductor L10 exists in series with the capacitor C1. The first winding wire 11 and the parasitic capacitor C10 of the first winding wire 11A equivalently form a parallel resonant circuit. Moreover, the second winding wire 12, the capacitor C1 and the parasitic inductor L10 of the capacitor C1 equivalently form a series resonant circuit 6.

Figure 3:
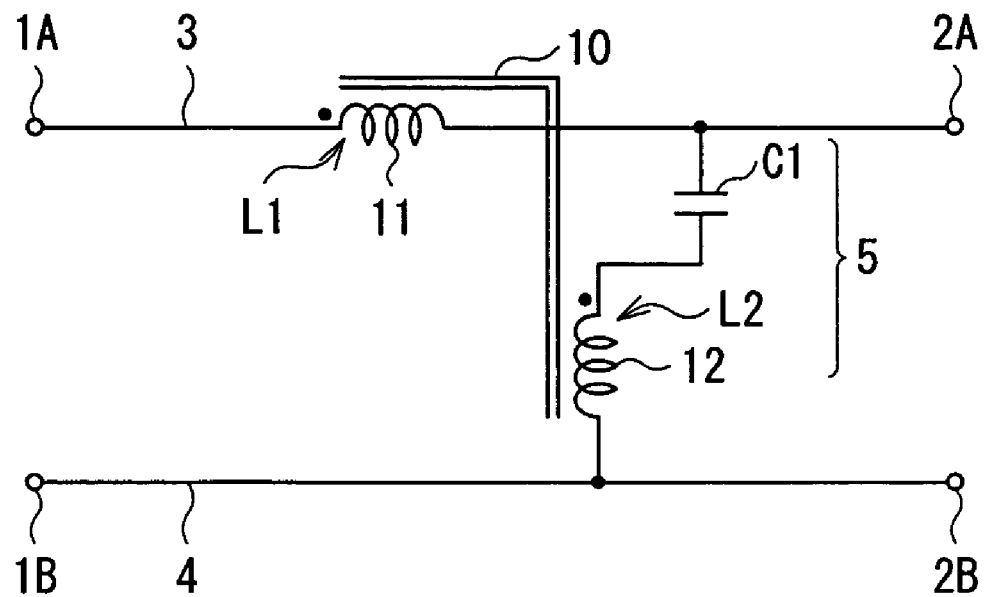
FIG. 3 is a circuit diagram showing a second example of the noise suppressor according to the first embodiment of the invention.

As shown in a second example in FIG. 3, a positional relationship between the second winding wire 12 and the capacitor C1 in the series circuit 5 may be opposite. More specifically, one end of the capacitor C1 may be connected to the first current-carrying wire 3, and the other end of the capacitor C1 may be connected to one end of the second winding wire 12, and the other end of the second winding wire 12 may be connected to the second current-carrying wire 4.

Figure 4:
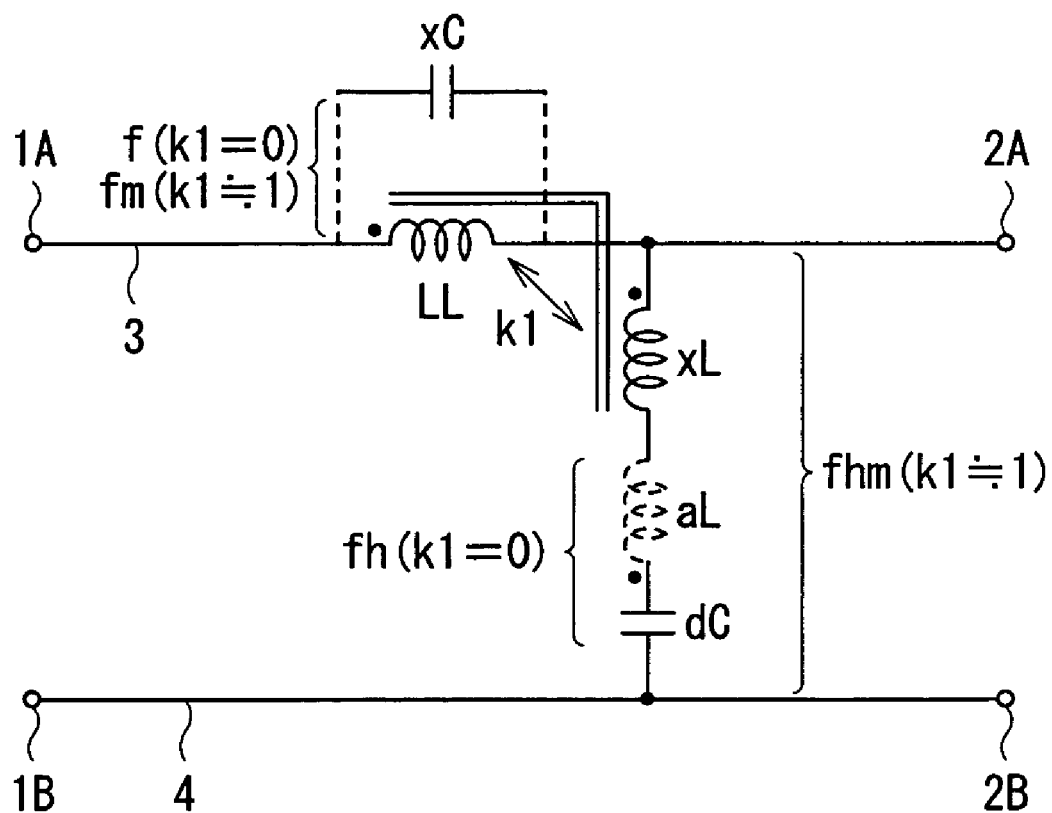
FIG. 4 is an illustration for describing a circuit value in the noise suppressor shown in FIG. 1.

Referring to FIG. 4, the circuit conditions of the noise suppressor will be described below.

As shown in FIG. 4, the inductance of the whole first winding wire 11 (a first inductor L1) is LL, the inductance of the whole second winding wire 12 (a second inductor L2) is xL, and the capacitance of the capacitor C1 is dC. Moreover, the inductance per turn in the first winding wire 11 is LL1. Further, the capacitance of the parasitic capacitor C10 is xC, and the inductance of the parasitic inductor L10 is aL. The coupling coefficient between the first winding wire 11 and the second winding wire 12 is k1.

The noise suppressor preferably satisfies the following conditions relating to the inductances of the first winding wire 11 and the second winding wire 12. First, the inductance xL of the whole second winding wire 12 is preferably set to be sufficiently smaller than the inductance LL of the whole first winding wire 11.

$xL \ll LL$

In particular, the inductance xL of the whole second winding wire 12 is preferably equal to or smaller than the inductance LL1 per turn in the first winding wire 11.

$xL \leq LL1$

Moreover, magnetic coupling between the first winding wire 11 and the second winding wire 12 is preferably strong. In other words, it is preferable that the coupling coefficient k1 is ideally k1≈1.

The noise suppressor preferably satisfies the following condition, where the resonant frequency by the capacitor C1 and the parasitic inductor L10 in the series resonant circuit 6 (the self-resonant frequency of the capacitor C1) in the case of k1=0 is fh, and the resonant frequency of the parallel resonant circuit by the first winding wire 11 and the parasitic capacitor C10 (the self-resonant frequency of the first winding wire 11) in the case of k1=0 is f.

$fh > f$

In the noise suppressor, when the resonant frequency of the whole series resonant circuit 6 in the case where the first winding wire 11 and the second winding wire 12 are magnetically coupled to each other (ideally in the case of k1≈1) is fhm, the resonant frequency of the parallel resonant circuit including the first winding wire 11 and the parasitic capacitor C10 in the case where the first winding wire 11 and the second winding wire 12 are magnetically coupled to each other in the same manner is fm, the following condition is preferably satisfied.

$fhm \geq fm$,

Next, the functions of the noise suppressor will be described below.

Figure 20:
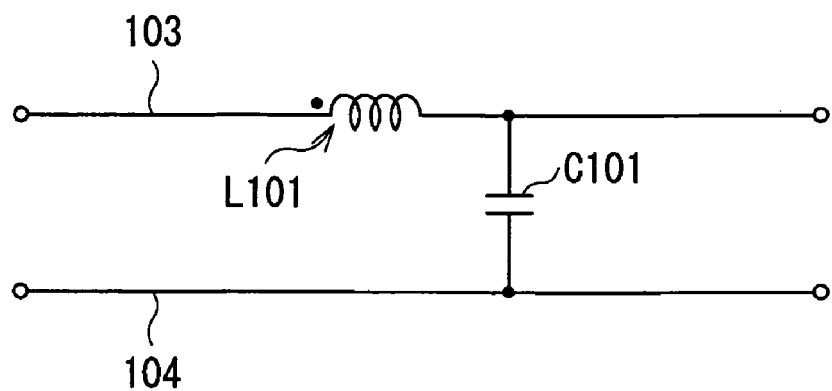
FIG. 20 is a circuit diagram showing an example of a filter circuit for normal mode noise prevention in a related art.

In the noise suppressor, a circuit for normal mode noise prevention which is an improved version of a LC filter circuit for normal mode in a related art (refer to FIG. 20) is formed. In the noise suppressor, the second winding wire 12 is magnetically coupled to the first winding wire 11, and the inductance xL of the second winding wire 12 is set to satisfy the above-described appropriate conditions, so even if the parasitic capacitor C10 is formed in the first winding wire 11, thereby a self-resonant point is produced, the self-resonant point can be moved to a higher frequency side. Thereby, the influence of the parasitic capacitor C10 can be equivalently reduced, and a favorable attenuation characteristic can be obtained. The characteristics of the noise suppressor will be considered in detail through the use of a simulation below.

Figure 5:
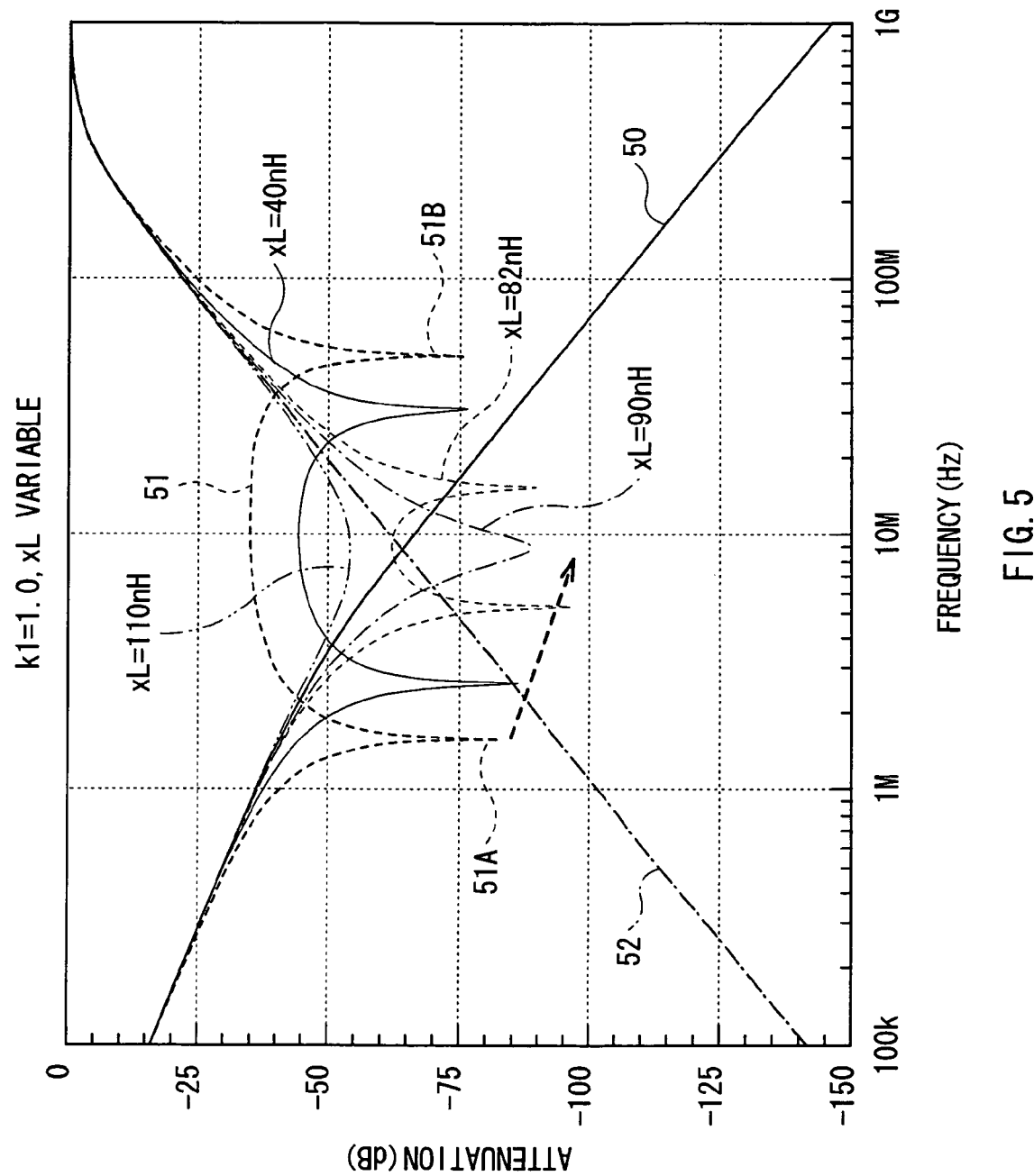
FIG. 5 is a plot showing an attenuation characteristic ($K1=1$) in the noise suppressor according to the first embodiment of the invention.
Figure 22:
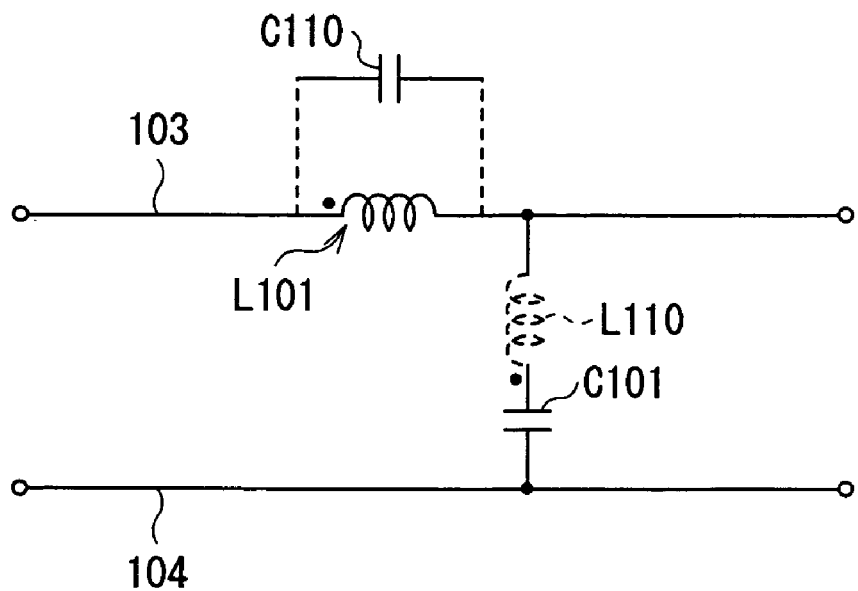
FIG. 22 is a circuit diagram showing an equivalent circuit in the case where a parasitic component in the filter circuit for normal mode noise in the related art is taken into account.
Figure 23:
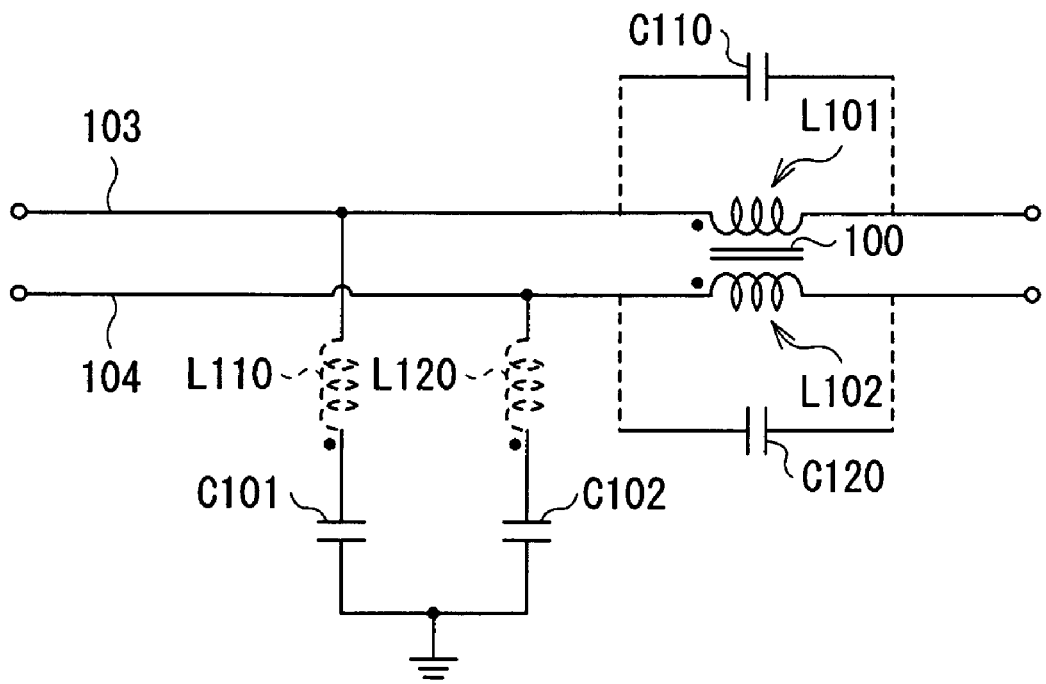
FIG. 23 is a circuit diagram showing an equivalent circuit in the case where a parasitic component in the filter circuit for common mode noise prevention in the related art is taken into account.

FIG. 5 shows a result of simulation of the attenuation characteristic when the inductance xL of the whole second winding wire 12 is changed as a parameter under the following circuit conditions. The inductance xL is a sufficiently smaller value than the inductance LL of the first winding wire 11 so as to satisfy the above-described conditions. The horizontal axis indicates frequency (Hz), and the vertical axis indicates attenuation (dB). For comparison, the characteristic of an ideal LC type filter circuit (corresponding to the structure of FIG. 20) in the case where no parasitic component exists is shown by a curve with a numeral 50, and the characteristic of a circuit including only a parasitic component (the parasitic capacitor C10 and the parasitic inductor L10) is shown by a curve with a numeral 52. Moreover, the characteristic of a LC type filter circuit including a parasitic component in a related art (corresponding to the structure of FIG. 22) is shown by a curve with a numeral 51.

Circuit Conditions
Input/output impedance=50Ω
Inductance LL of first winding wire 11=1 mH
Capacitance dC of capacitor C1=1000 pF
Capacitance xC of parasitic capacitor C10=10 pF
Inductance aL of parasitic inductor L10=10 nH
Coupling coefficient k1=1

At first, in the LC type filter circuit in the related art shown by the numeral 51, a self-resonant point 51A by the first winding wire 11 and the parasitic capacitor C10 is produced on a low frequency side, and a self-resonant point 51B by the capacitor C1 and the parasitic inductor L10 is produced on a high frequency side. The attenuation characteristic is degraded on a higher frequency side than the self-resonant point 51A by the first winding wire 11 up to the self-resonant point 51B. It is caused by the influence of the parasitic capacitor C10 of the first winding wire 11. The self-resonant point 51A is a limit value at which the inductor L1 by the first winding wire 11 functions as an inductor, and the inductor L1 functions not as an inductor but as a capacitor at a frequency equal to or higher than the self-resonant point 51A. An ideal operation as an inductor can be performed until the self-resonant point 51A as a limit, and even if the capacitor C1 is used at a frequency higher than the self-resonant point 51A, the relationship between the capacitor C1 and the parasitic capacitor C10 is a simple voltage split ratio (xC/dC), so it is difficult to decrease a gain. In other words, only an attenuation determined by a relationship between xC and dC can be obtained between two self-resonant points 51A and 51B. For example, through selecting a core material or devising a winding method, the LC type filter circuit can be improved to some extent so as to reduce the parasitic capacitor C10 and to move the self-resonant point 51A to a higher frequency side; however, in reality, it is very difficult to increase the amount of movement. For example, in the case where the first winding wire 11 have a small number of turns, it is necessary to increase the inductance per turn, and a parasitic capacitor component with a large self-resonant point formed by the impedance characteristic of the core 10 is included.

On the other hand, in the noise suppressor according to the embodiment, the second winding wire 12 is magnetically coupled to the first winding wire 11 so as to adjust the value of the inductance xL within a range to some extent, thereby as shown in the drawing, the self-resonant point 51A of the first winding wire 11 can be shifted to a higher frequency side. In other words, the parasitic capacitance xC is reduced, thereby the self-resonant point 51A of the first winding wire 11 can be equivalently shifted to several times higher frequency. In this case, the self-resonant point 51A can be extended to a higher frequency side along the attenuation characteristic of the ideal LC filter shown by the numeral 50. Therefore, for example, in the case where a large core is used to reduce the number of turns in the first winding wire 11, the self-resonant point 51A can be produced on a low frequency side; however, the self-resonant point 51A can be extended to a higher frequency side, so while reducing the number of turns, the attenuation characteristic can be improved, and size reduction of the circuit can be achieved.

While the self-resonant point 51A is moved to a higher frequency side, the self-resonant point 51B of the capacitor C1 is moved to a lower frequency side, so practically, the limit point of the movement of the self-resonant point 51A is disposed around an area where two self-resonant points 51A and 51B are in proximity to each other (in FIG. 5, in the case of xL=approximately 90 nH). The point is an adjustment limit point in the noise suppressor. From this point of view, the above-described conditions, that is, fh>f and fhm≧fm are preferably satisfied.

Figure 6:
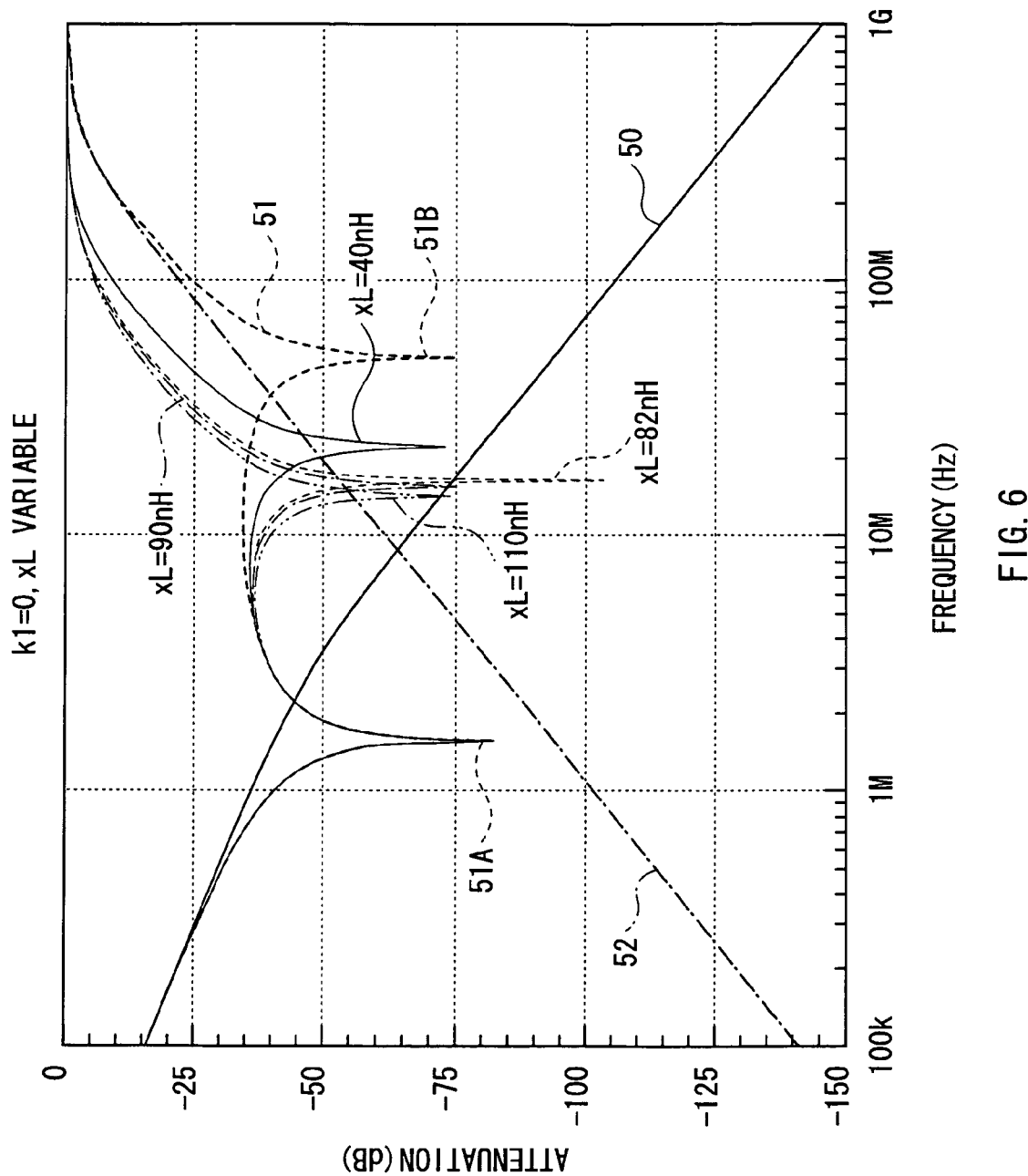
FIG. 6 is a plot showing an attenuation characteristic ($K1=0$) in the noise suppressor according to the first embodiment of the invention.
Figure 7:
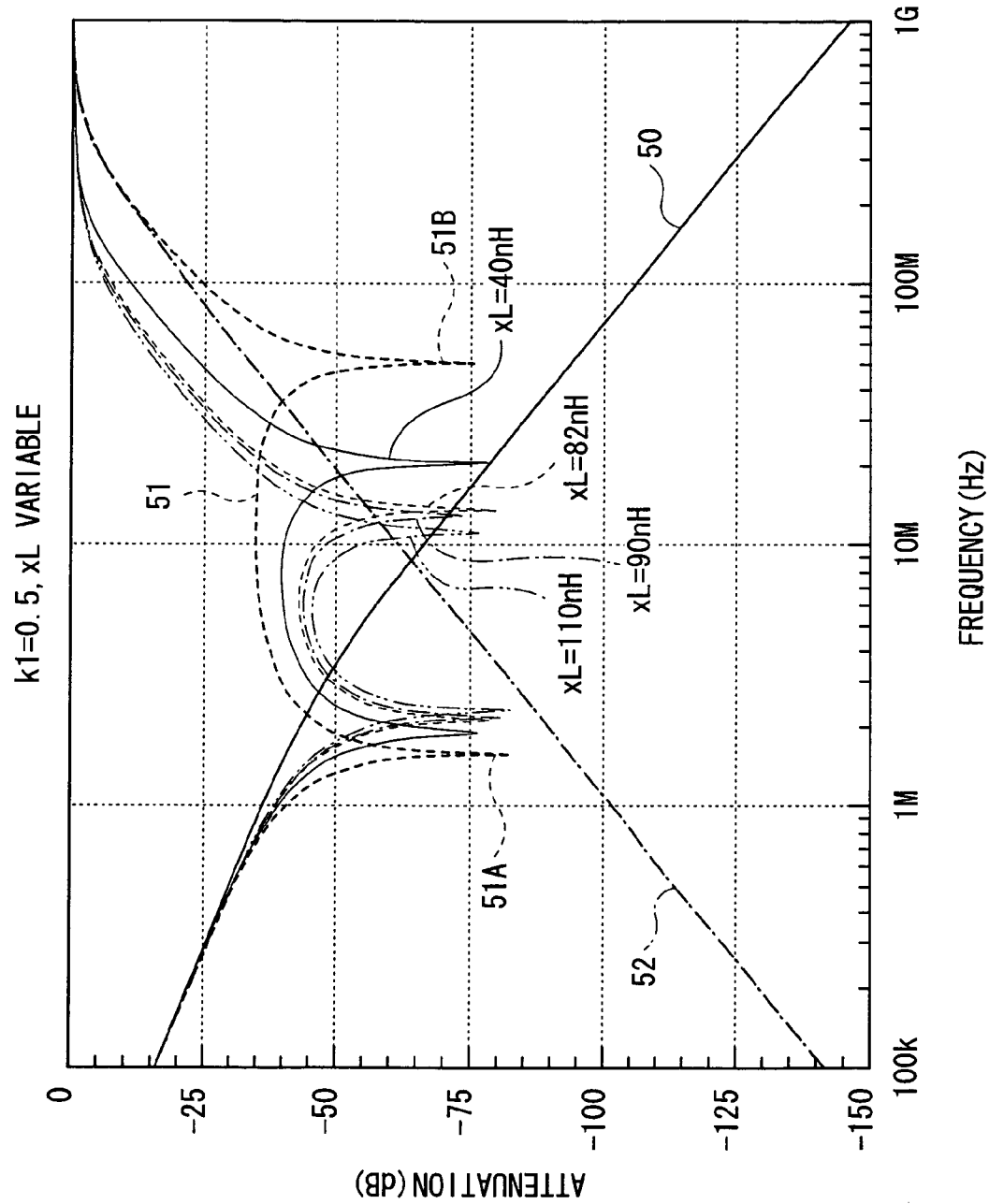
FIG. 7 is a plot showing an attenuation characteristic ($K1=0.5$) in the noise suppressor according to the first embodiment of the invention.
Figure 8:
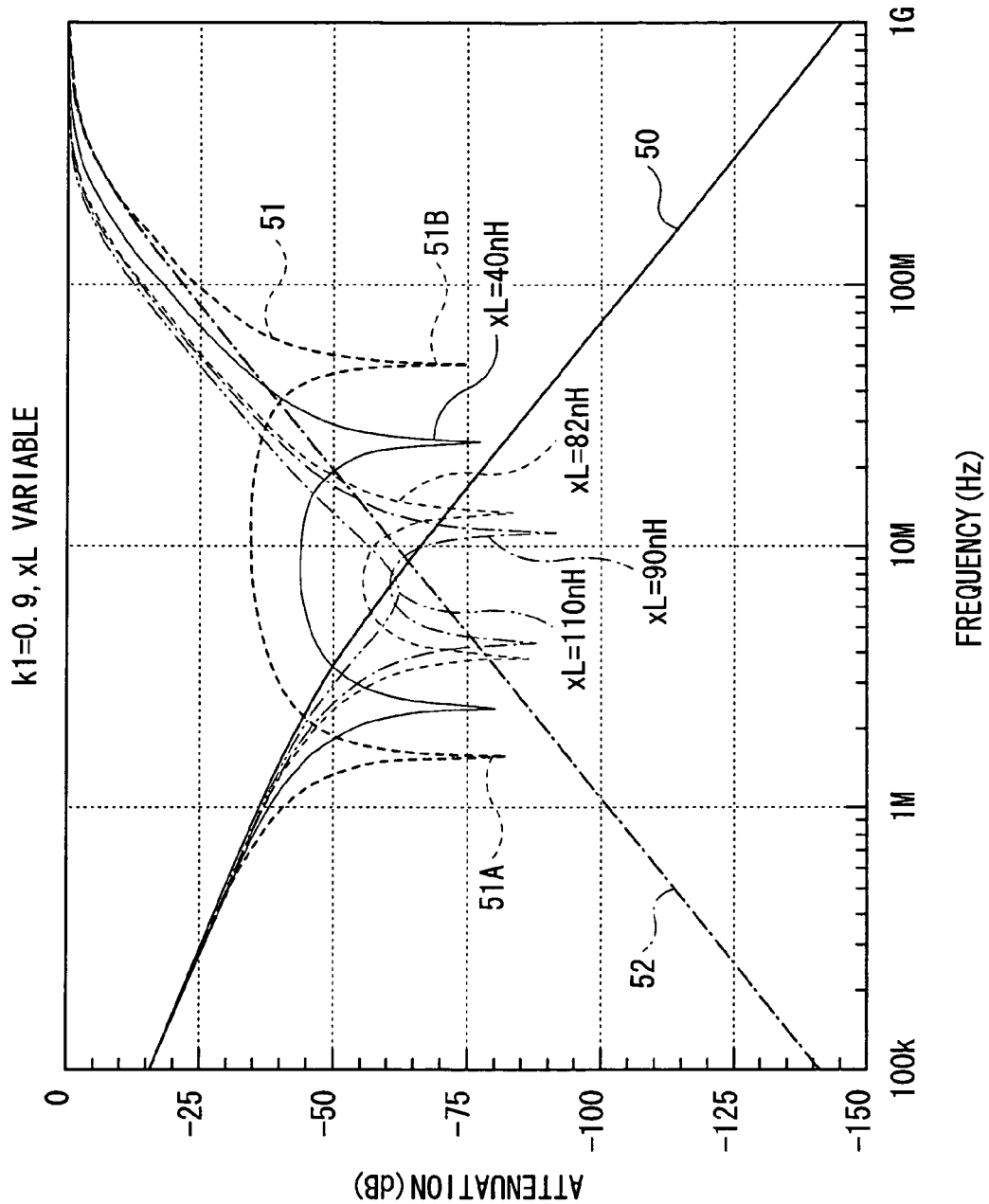
FIG. 8 is a plot showing an attenuation characteristic ($K1=0.9$) in the noise suppressor according to the first embodiment of the invention.
Figure 9:
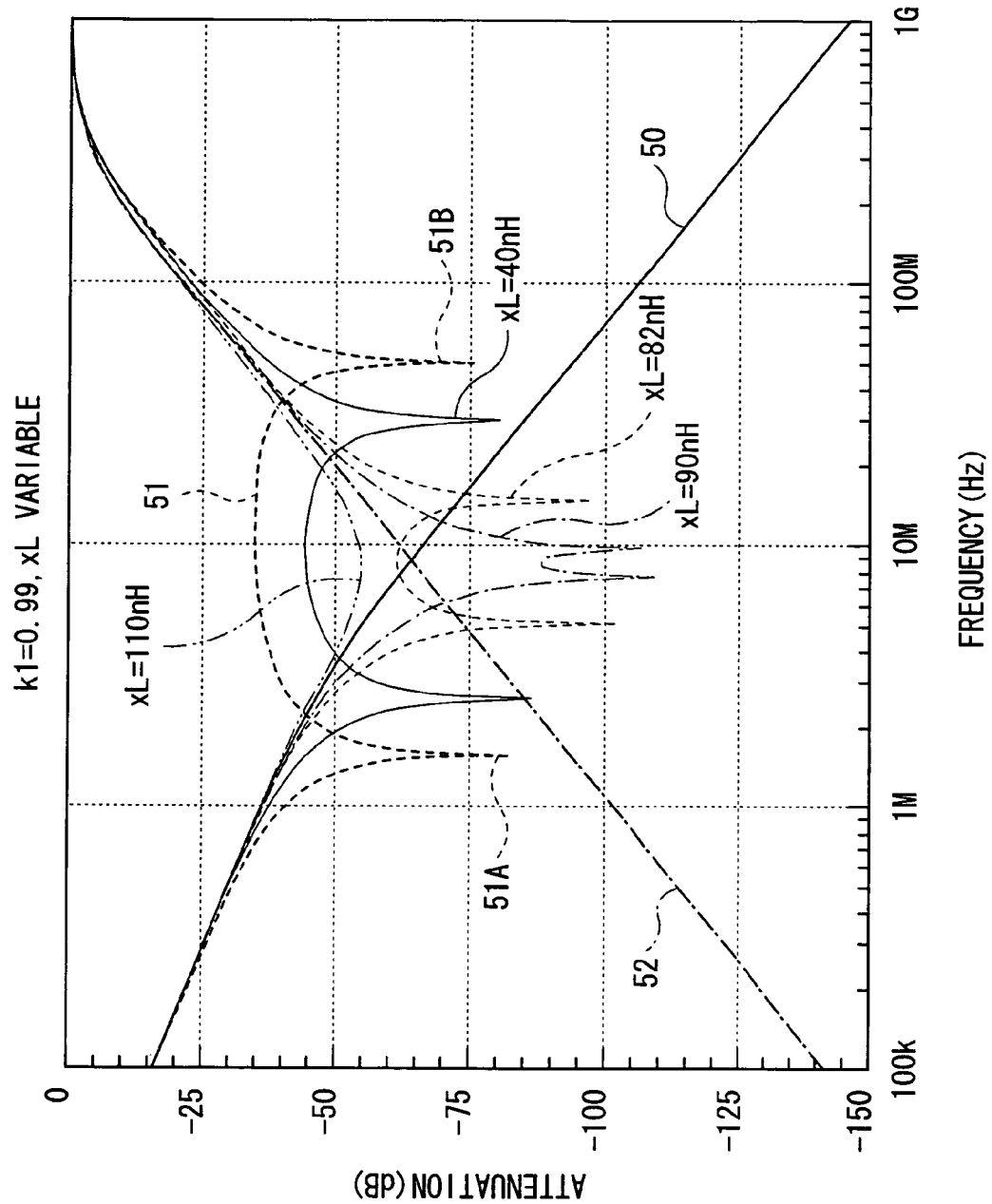
FIG. 9 is a plot showing an attenuation characteristic ($K1=0.99$) in the noise suppressor according to the first embodiment of the invention.

FIG. 5 shows the characteristic in the case where the coupling coefficient k1 between the first winding wire 11 and the second winding wire 12 is 1 so that magnetic coupling is ideal is shown; however, in reality, it is difficult for the coupling coefficient k1 to be 1. Next, the characteristic in the case where the value of the coupling coefficient k1 is changed is determined by simulation in the same manner. The results are shown in FIGS. 6 through 9. Circuit conditions except for the value of the coupling coefficient k1 are the same as those in the case of FIG. 5. FIG. 6, FIG. 7 and FIG. 8 show the characteristics in the case of k1=0, k1=0.5, and k1=0.99, respectively.

The case of k1=0 (refer to FIG. 6) means the case where no magnetic coupling occurs between the first winding wire 11 and the second winding wire 12, and a circuit which is the LC type filter circuit in the related art to which an inductor component by the second winding wire 12 is simply added is formed, so the high frequency characteristic on the side of the self-resonant point 51B of the capacitor C1 is degraded. Moreover, the movement effect and improvement effect of the self-resonant point 51A of the first winding wire 11 are not obtained. On the other hand, in the case of k1=0.5 (refer to FIG. 7), compared to the case of k1=0, the characteristic of the movement of the self-resonant point 51A by the first winding wire 11 starts to be exhibited, but the improvememt effect is small. Moreover, degradation in the high frequency characteristic on the side of the self-resonant point 51B of the capacitor C1 is observed. Therefore, the performance is still not sufficient.

In the case of k1=0.9 in which the extent of magnetic coupling is relatively strong (refer to FIG. 8), the improvement effect by the movement of the self-resonant point 51A is sufficiently obtained; however, degradation in the high frequency characteristic on the side of the self-resonant point 51B still remains. Moreover, in the case of k1=0.99 in which magnetic coupling is higher (refer to FIG. 9), the same performance as that in the case of k1=1 in which the coupling state is ideal (refer to FIG. 5) can be obtained. Thus, when magnetic coupling between the first winding wire 11 and the second winding wire 12 is strong, the movement effect of the self-resonant point 51 can be obtained, and the attenuation characteristic on a higher frequency side than the self-resonant point 51A after movement becomes more favorable. Therefore, when k1 is 0.9 or more, preferably when k1 is approximately 0.99, sufficient performance can be obtained.

As described above, in the noise suppressor according to the embodiment, the second winding wire 12 is magnetically coupled to the first winding wire 11 disposed on the first current-carrying wire 3, and the inductance xL of the second winding wire 12 is set to satisfy appropriate conditions, so even if the parasitic capacitor C10 is formed in the first winding wire 11, thereby a self-resonant point is produced, the self-resonant point can be moved to a higher frequency side, and the influence of the parasitic capacitor C10 can be equivalently reduced. Thereby, degradation in the attenuation characteristic by the parasitic component can be prevented so as to obtain a favorable attenuation characteristic.

In particular, in the embodiment, the first winding wire 11 and the second winding wire 12 are magnetically coupled to each other via the common core 10, so each winding wire can be magnetically coupled to the other winding wire through the use of a simple structure, and size reduction can be easily made.

Second Embodiment

Next, a noise suppressor according to a second embodiment of the invention will be described below.

In the noise suppressor according to the above-described first embodiment, as one condition, the inductance xL of the whole second winding wire 12 is equal to or smaller than the inductance LL1 per turn in the first winding wire 11. Moreover, magnetic coupling between the first winding wire 11 and the second winding wire 12 is preferably strong (ideally, the coupling coefficient k1≈1). However, in the case of the structure in which the first winding wire 11 and the second winding wire 12 are magnetically coupled directly to each other via the common core 10, it is difficult to satisfy the condition of xL≦LL1, and for the inductance xL to be smaller than the inductance LL1 per turn while magnetic coupling between the first winding wire 11 and the second winding wire 12 is kept strong.

Figure 10:
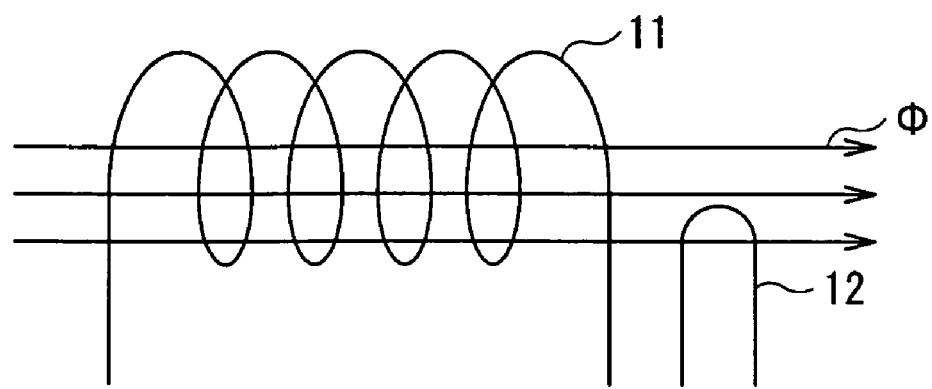
FIG. 10 is an illustration for describing a relationship between coupling between two winding wires and inductance.

For example, as shown in FIG. 10, when the second winding wire 12 is wound so that only a part of a magnetic flux Φ by the first winding wire 11 crosses over the second winding wire 12, the inductance xL of the second winding wire 12 can be smaller than the inductance LL1 per turn in the first winding wire 11. It means that a magnetic path by the first winding wire 11 and a magnetic path by the second winding wire 12 are separated. However, in this case, the number of magnetic fluxes shared between the winding wires is reduced, so it is difficult to achieve high coupling such as k1≈1. Therefore, in the embodiment, while an appropriate condition of the inductance xL of the second winding wire 12 is satisfied, a circuit which can easily achieve a condition for high coupling is provided.

Figure 11:
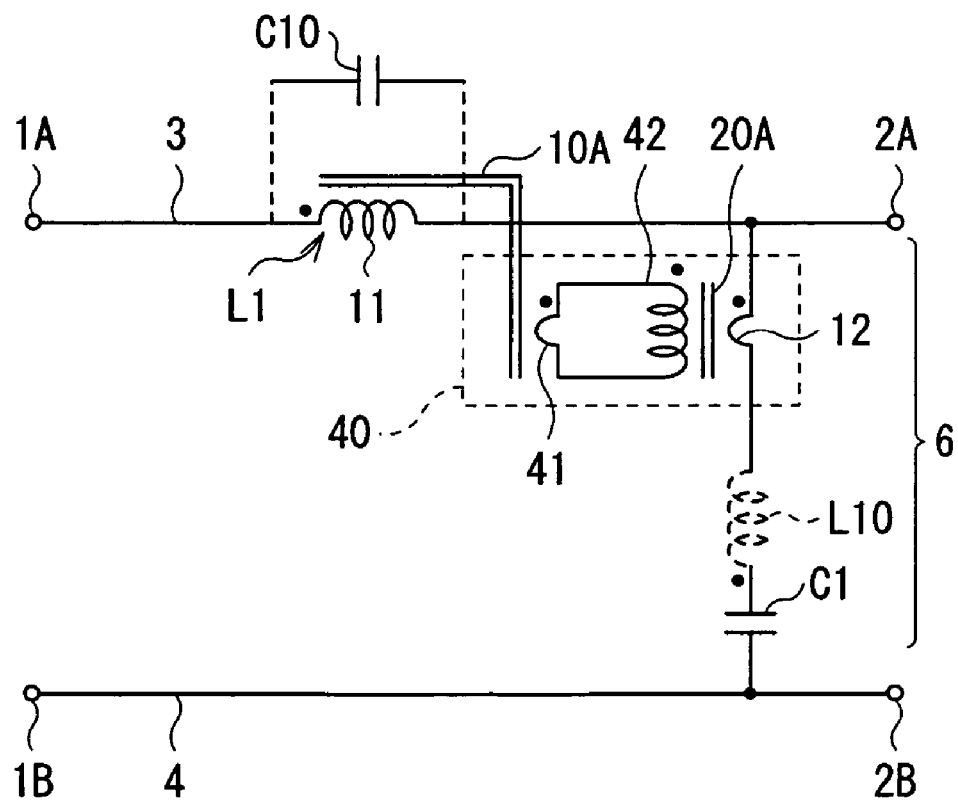
FIG. 11 is a circuit diagram showing a first example of a noise suppressor according to a second embodiment of the invention.

FIG. 11 shows an example of the noise suppressor according to the embodiment. The embodiment relates to a circuit for normal mode noise prevention as in the case of the first embodiment. In the embodiment, like components are denoted by like numerals as of the noise suppressor according to the first embodiment and will not be further described. In FIG. 11, as in the case of FIG. 2, the structure of an equivalent circuit including a parasitic component is shown.

In the noise suppressor, compared to the noise suppressor according to the first embodiment shown in FIG. 2, the structure of a circuit 40, that is, a coupling portion between the first winding wire 11 and the second winding wire 12 is different. The noise suppressor includes two cores 10A and 20A instead of the core 10 around which the first winding wire 11 and the second winding wire 12 are commonly wound. The noise suppressor further includes a first coupling winding wire 41 and a second coupling winding wire 42. The first winding wire 11 is wound on a primary side of the first core 10A, and the first coupling winding wire 41 is wound on a secondary side of the first core 10A. Moreover, the second coupling winding wire 42 is wound on a primary side of the second core 20A, and the second winding wire 12 is wound on a secondary side of the second core 20A. The first coupling winding wire 41 and the second coupling winding wire 42 are connected to each other. Thereby, equivalently, the first winding wire 11 and the second winding wire 12 are magnetically coupled to each other via the first and the second winding wires for coupling 41 and 42.

Figure 12:
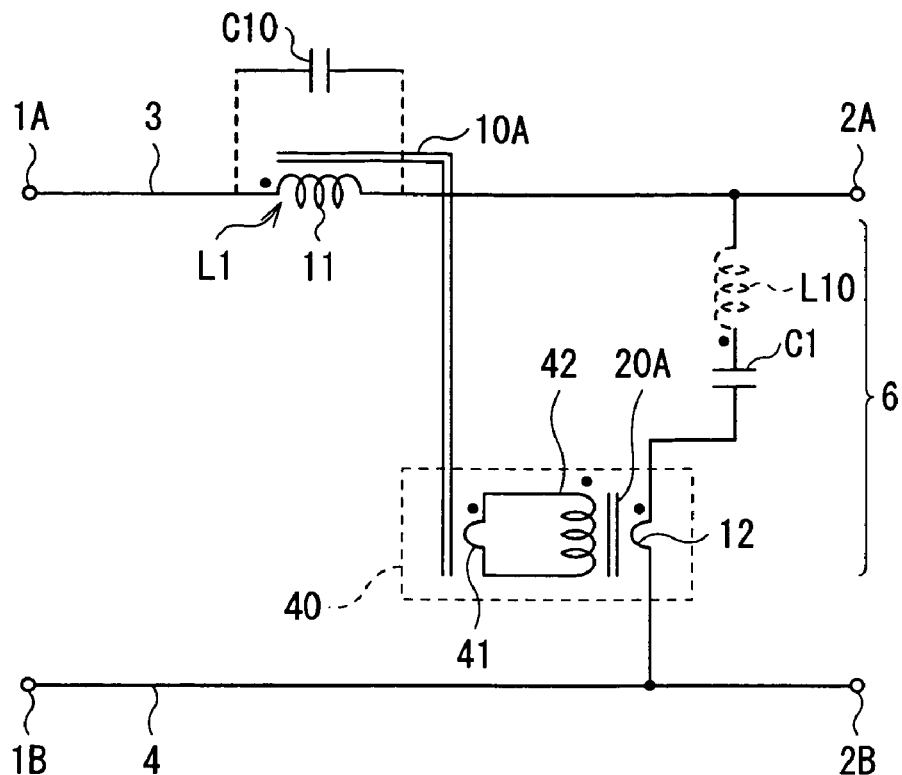
FIG. 12 is a circuit diagram showing a second example of the noise suppressor according to the second embodiment of the invention.

As shown in a second example of FIG. 12, the positional relationship between the second winding wire 12 and the capacitor C1 in the series resonant circuit 6 may be opposite. More specifically, the capacitor C1 may be disposed on a side closer to the first current-carrying wire 3, and the second winding wire 12 may be disposed on a side closer to the second current-carrying wire 4.

In the noise suppressor, the first winding wire 11 and the second winding wire 12 are wound around the first core 10A and the second core 20A, respectively, and the first winding wire 11 and the second winding wire 12 are magnetically coupled to each other via the first and the second coupling winding wires 41 and 42 equivalently, so while magnetic coupling between the first winding wire 11 and the second winding wire 12 is kept strong equivalently, the inductance xL of the whole second winding wire 12 can be easily reduced. For example, in the case where the magnetic permeability of the first core 10A is μ1, and the magnetic permeability of the second core 20A is μ2, when μ1>μ2 is satisfied, and the shape and the number of turns are appropriately set, the inductance of the second winding wire 12 can be smaller than that of the first winding wire 11. Moreover, the first winding wire 11 and the second winding wire 12 may be made of different materials.

Figure 13A:
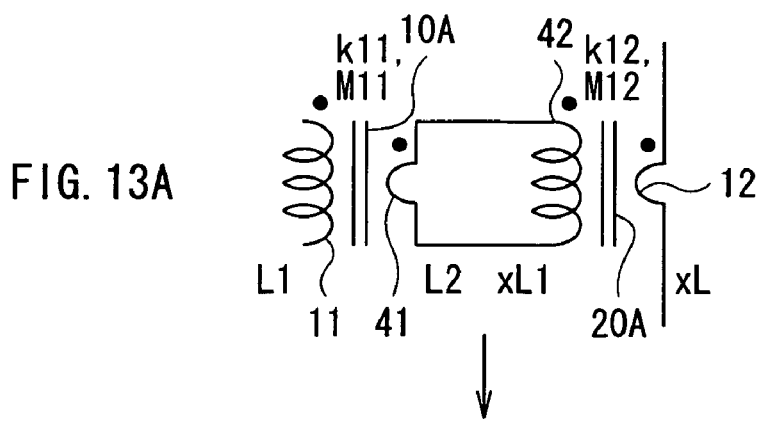
FIGS. 13A and 13B are illustrations for describing a coupling function between winding wires in the noise suppressor according to the second embodiment of the invention.
Figure 13B:
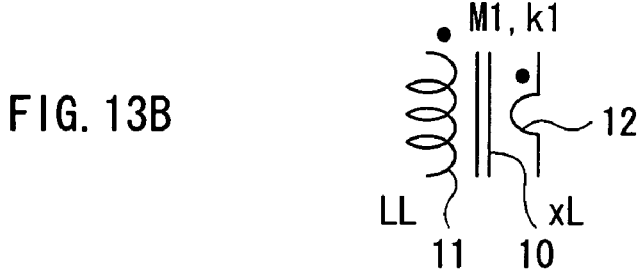

Referring to FIGS. 13A and 13B, the conditions of the circuit 40 which is the coupling portion will be described below. In the first core 10A, the first coupling winding wire 41 is wound on the secondary side in the same direction as the direction where the first winding wire 11 is wound on the primary side, and the first coupling winding wire 41 has a sufficiently smaller number of turns (ideally one turn) than the number of turns in the first winding wire 11. The second winding wire 12 has the number of turns (for example one turn) by which a desired characteristic can be obtained at the inductance LL1 or less per turn in the first winding wire 11. As described above, the inductance xL can be easily reduced so as to be smaller than the inductance LL1 per turn in the first winding wire 11 through changing the materials of the first core 10A and the second core 20A. In the second core 20A, the second coupling winding wire 42 is wound on the primary side in the same direction as the direction where the second winding wire 12 is wound, and the second coupling winding wire 42 has a sufficiently larger number of turns than that in the second winding wire 12.

As shown in FIG. 13A, mutual inductance between winding wires on the primary side and the secondary side in the first core 10A is M11, the coupling coefficient between winding wires on the primary side and the secondary side in the first core 10A is k11, mutual inductance between winding wires on the primary side and the secondary side in the second core 20A is M12, and the coupling coefficient between winding wires on the primary side and the secondary side in the second core 20A is k12. Moreover, the inductance of a winding portion on the primary side in the first core 10A is L1, the inductance of a winding wire portion on the secondary side is L2, the inductance of a winding wire portion on the primary side in the second core 20A is xL1, and the inductance of a winding wire portion on the secondary side is xL. In this case, the following formulas are established.

$$M11 = k11\sqrt{L1 \times L2}$$

$$M12 = k12\sqrt{xL1 \times xL}$$

In addition, $\sqrt{L1 \times L2}$ represents the square root of L1×L2, and the $\sqrt{xL1 \times xL}$ represents the square root of xL1×xL.

The inductance xL1 of a winding wire portion on the primary side in the second core 20A is sufficiently larger than the inductance L2 of a winding wire portion on the primary side in the first core 10A, and the coupling coefficients k11 and k12 in each core is in a high coupling state. In other words, when the following conditions are satisfied, the first winding wire 11 and the second winding wire 12 can be in a high coupling state (k1≈1) equivalently.

$$xL1 \gg L2$$

$$k11, k12 \approx 1$$

More specifically, it can be considered that the circuit shown in FIG. 13A is equivalently the same as the circuit shown in FIG. 13B. In this case, the first and the second coupling winding wires 41 and 42 cause a loss; however, the loss is sufficiently negligible. In this case, in the mutual inductance M1 between the winding wires on the primary side and the secondary side in the core 10, the following formula is established equivalently.

$$M1 = k1\sqrt{LL \times xL}$$

In addition, $\sqrt{LL \times xL}$ indicates the square root of LL×xL. Therefore, it can be considered that the noise suppressor according to the embodiment shown in FIG. 11 is equivalently the same as the noise suppressor according to the first embodiment shown in FIG. 2.

Thus, in the noise suppressor according to the embodiment, the first winding wire 11 and the second winding wire 12 are wound around the first core 10A and the second core 20A, respectively, and the first winding wire 11 and the second winding wire 12 are magnetically coupled to each other via the first and the second coupling winding wires 41 and 42 equivalently, so while magnetic coupling between the first winding wire 11 and the second winding wire 12 are equivalently in a high coupling state, the inductance xL of the whole second winding wire 12 can be easily reduced to be smaller than the inductance LL1 per turn in the first winding wire 11.

Third Embodiment

Next, a noise suppressor according to a third embodiment of the invention will be described below.

Figure 14:
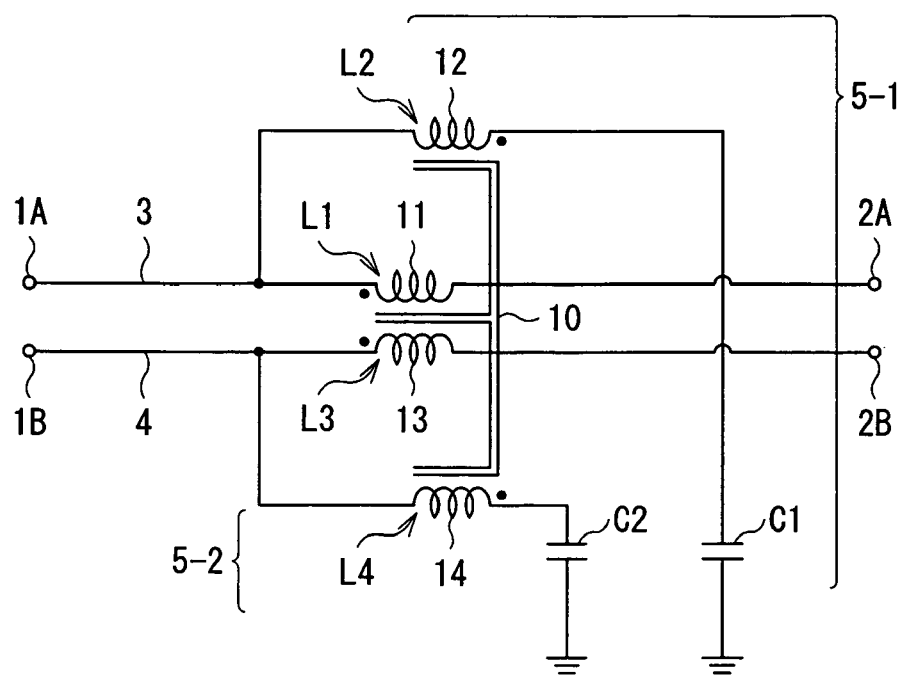
FIG. 14 is a circuit diagram showing an example of a noise suppressor according to a third embodiment of the invention.

FIG. 14 shows an example of the noise suppressor according to the embodiment. The embodiment relates to a circuit for common mode noise prevention. In the embodiment, like components are denoted by like numerals as of the noise suppressor according to the first and the second embodiments and will not be further described.

The noise suppressor includes the first winding wire 11 disposed on the first current-carrying-wire 3 and a first series circuit 5-1 having one end connected to the first current-carrying wire 3 and the other end connected to ground. The first series circuit 5-1 includes the first capacitor C1 and the second winding wire 12 which are connected to each other in series. One end of the second winding wire 12 is connected to the first current-carrying wire 3, and the other end of the second winding wire 12 is connected to one end of the first capacitor C1. The other end of the capacitor C1 is connected to ground. The noise suppressor further includes a third winding wire 13 which is disposed on the second current-carrying wire 4 and is magnetically coupled to the first winding wire 11, and a second series circuit 5-2 having one end connected to the second current-carrying wire 4 and the other end connected to ground. The second series circuit 5-2 includes a second capacitor C2 and a fourth winding wire 14 which are connected to each other in series. One end of the fourth winding wire 14 is connected to the second current-carrying wire 4, and the other end of the fourth winding wire 14 is connected to one end of the second capacitor C2. The other end of the second capacitor C2 is connected to ground.

The noise suppressor further includes the core 10 around which the first and the second winding wires 11 and 12 and the third and the fourth winding wires 13 and 14 are commonly wound, and they are magnetically coupled directly to one another via the common core 10. The first and the second winding wires 11 and 12 and the core 10 around which the first and the second winding wires 11 and 12 are commonly wound form the first and the second conductors L1 and L2 in each winding wire portion. Likewise, the third and the fourth winding wires 13 and 14 and the core 10 around which the third and the fourth winding wires 13 and 14 are commonly wound form a third inductor L3 and a fourth inductor L4 in each winding wire portion. Each inductor is formed by the same common core 10, so they are magnetically coupled to one another. In the drawing, a black circle symbol shown in each winding wire indicates the polarity of the winding wire, that is, a winding direction. The polarities of the first and the second winding wires 11 and 12 and the polarities of the third and the fourth winding wires 13 and 14 are preferably in the same direction. The first and the third winding wires 11 and 13 are magnetically coupled to each other through winding the first and the third winding wires 11 and 13 around the common core 10 so as to prevent common mode noise in cooperation, thereby they form a common mode choke coil.

Figure 15:
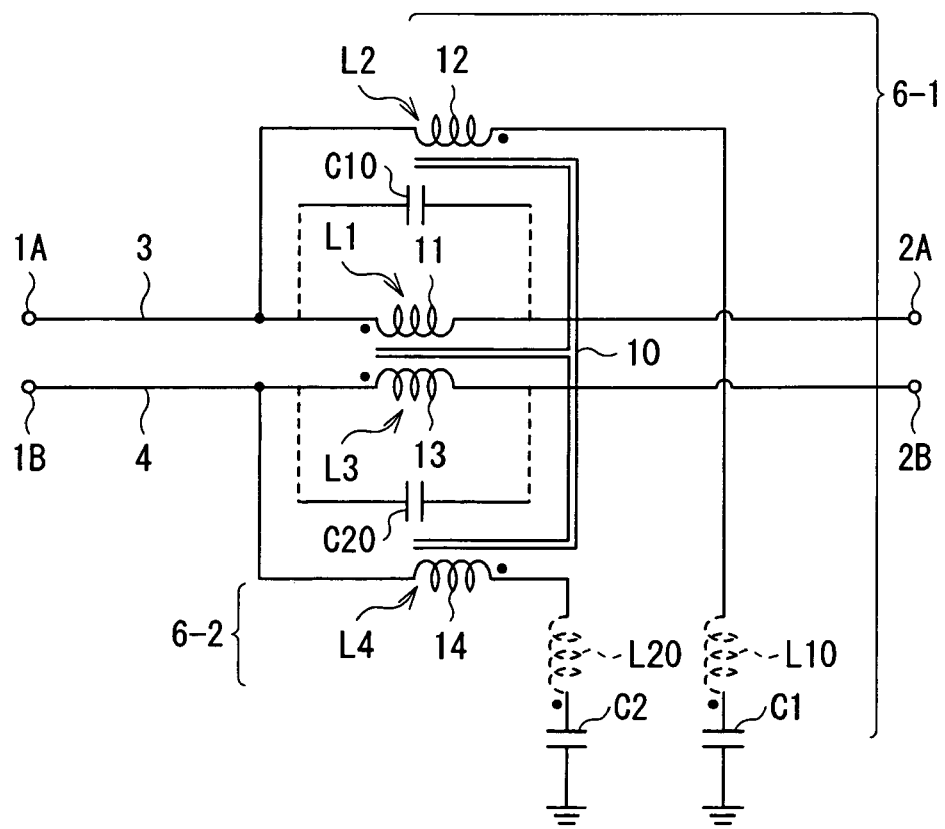
FIG. 15 is a circuit diagram showing an equivalent circuit in the case where a parasitic component in the noise suppressor shown in FIG. 14 is taken into account.

FIG. 15 shows an equivalent circuit in the case where a parasitic component in the noise suppressor is taken into account. As shown in the drawing, the parasitic capacitor C10 exists in parallel with the first winding wire 11, and the parasitic inductor L10 exists in series with the first capacitor C1. The first winding wire 11 and the parasitic capacitor C10 of the first winding wire 11 equivalently form a first parallel resonant circuit. Moreover, the second winding wire 12, the first capacitor C1 and the parasitic inductor L10 of the first capacitor C1 equivalently form a first series resonant circuit 6-1. Likewise, a parasitic capacitor C20 exists in parallel with the third winding wire 13, and a parasitic inductor L20 exists in series with the second capacitor C2. The third winding wire 13 and the parasitic capacitor C20 of the third winding wire 13 equivalently form a second parallel resonant circuit. Moreover, the fourth winding wire 14, the second capacitor C2 and the parasitic inductor L20 of the capacitor C2 equivalently form a second series resonant circuit 6-2.

Figure 16:
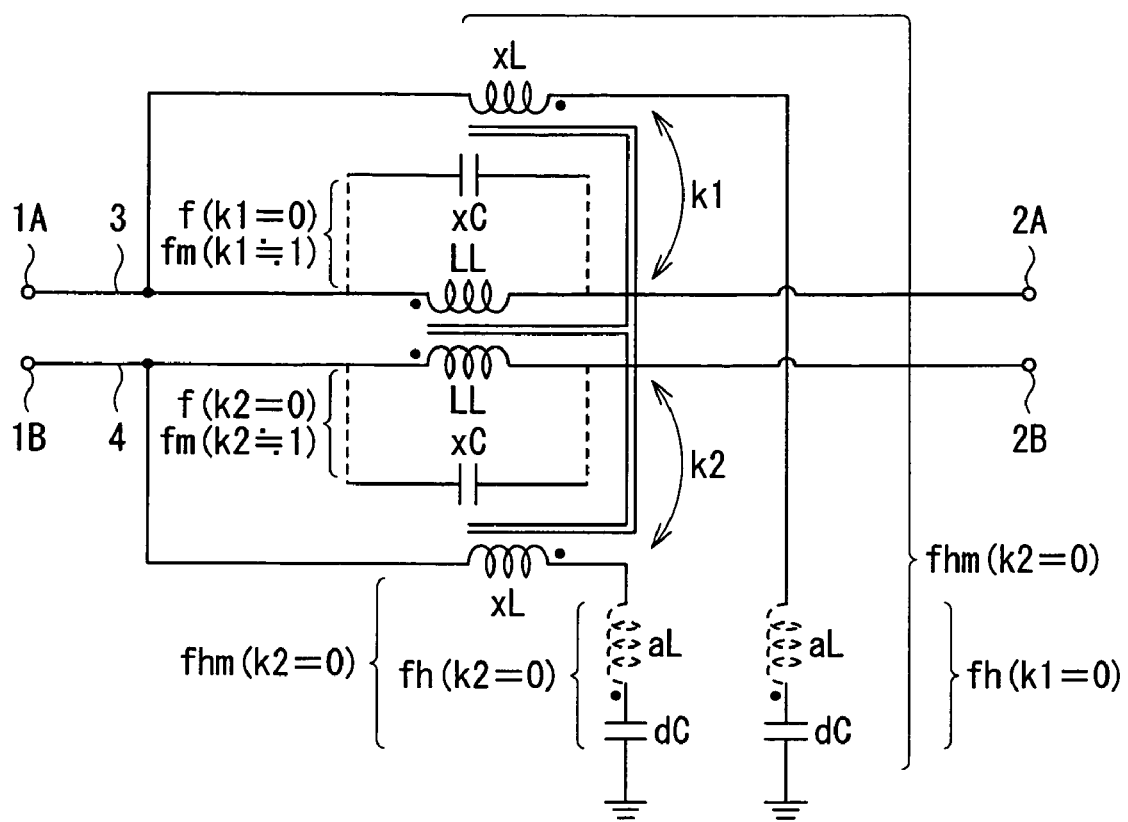
FIG. 16 is an illustration for describing a circuit value in the noise suppressor according to the third embodiment of the invention.

When the noise suppressor satisfies the same circuit conditions as those in the circuit according to the first embodiment, the noise suppressor can obtain a favorable attenuation characteristic. As shown in FIG. 16, circuit values in the first parallel resonant circuit and the first series resonant circuit 6-1 will be described through the use of the same symbols of the circuit values shown in FIG. 4. Circuit values cin the second parallel resonant circuit and the second series resonant circuit 6-2 corresponding to the circuit values shown in FIG. 4 will be described through the use of the same symbols.

In other words, in the noise suppressor, the inductance xL of the whole second winding wire 12 is preferably set to be sufficiently smaller than the inductance LL of the whole first winding wire 11. In particular, the inductance xL of the whole second winding wire 12 is more preferably set to be equal to or smaller than the inductance LL1 per turn in the first winding wire 11. Likewise, the inductance xL of the whole fourth winding wire 14 is preferably set to be sufficiently smaller than the inductance LL of the whole third winding wire 13. In particular, the inductance xL of the whole fourth winding wire 14 is more preferably equal to or smaller than the inductance LL1 per turn in the third winding wire 13. In other words, the following conditions are preferably satisfied.

$$xL \ll LL$$

$$xL \leq LL1$$

Moreover, magnetic coupling between the first winding wire 11 and the second winding wire 12 is preferably strong. In other words, it is preferable that the coupling coefficient k1 is ideally k1≈1. Likewise, magnetic coupling between the third winding wire 13 and the fourth winding wire 14 is preferably strong. In other words, when the coupling coefficient is k2, it is preferable that ideally k2≈1 is established.

The noise suppressor preferably satisfies the following condition, where the resonant frequency by the first capacitor C1 and the parasitic inductor L10 in the first series resonant circuit 6-1 (the self-resonant frequency of the capacitor C1) in the case of k1, k2=0 is fh, and the resonant frequency of the first parallel resonant circuit (the self-resonant frequency of the first winding wire 11) in the case of k1, k2=0 is f.

$$fh > f$$

Likewise, the noise suppressor preferably satisfies the above relationship, where the resonant frequency by the second capacitor C2 and the parasitic inductor L20 in the second series resonant circuit 6-2 (the self-resonant frequency of the capacitor C2) in the case of k1, k2=0 is fh, and the resonant frequency of the second parallel resonant circuit in the case of k1, k2=0 is f.

Moreover, the following condition is preferably satisfied, where the resonant frequency of the whole first series resonant circuit 6-1 in the case where the first winding wire 11 and the second winding wire 12 are magnetically coupled (ideally in the case of k1≈1) is fhm, and the resonant frequency of the first parallel resonant circuit in the case where the first winding wire 11 and the second winding wire 12 are magnetically coupled is fm.

$$fhm \geq fm$$

Likewise, the above-described relationship is preferably satisfied, where the resonant frequency of the whole second resonant circuit 6-2 in the case where the third winding wire 13 and the fourth winding wire 14 are magnetically coupled (ideally in the case of k2≈1) is fhm, and the resonant frequency of the second parallel resonant circuit in the case where the third winding wire 13 and the fourth winding wire 14 are magnetically coupled is fm.

Next, the functions of the noise suppressor will be described below.

Figure 21:
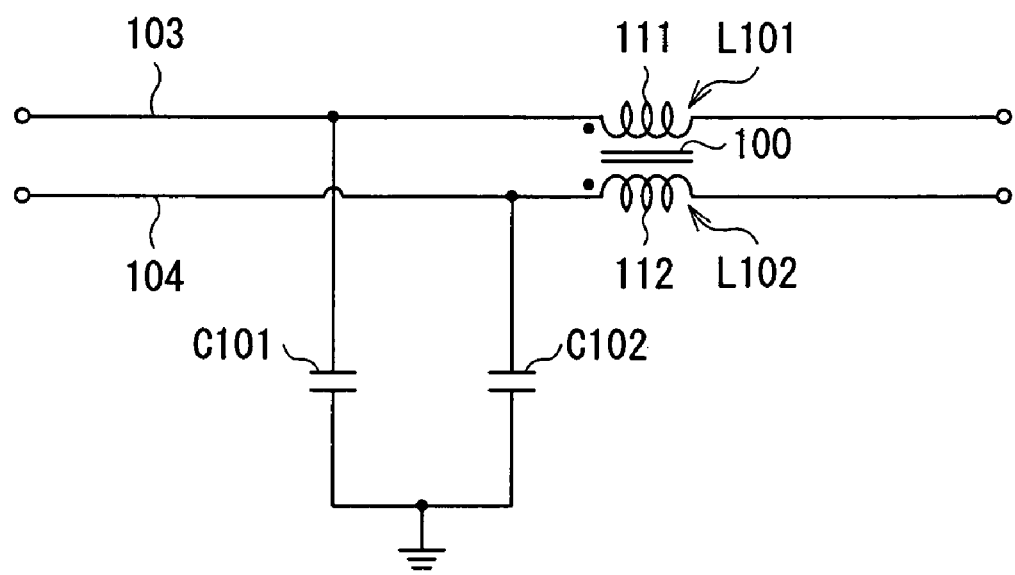
FIG. 21 is a circuit diagram showing an example of a filter circuit for common mode noise prevention in a related art.

In the noise suppressor, a circuit for common mode noise prevention which is an improved version of a LC filter circuit for common mode in a related art (refer to FIG. 21) is formed. In the noise suppressor, the second winding wire 12 is magnetically coupled to the first winding wire 11, and the fourth winding wire 14 is magnetically coupled to the third winding wire 13, and the inductance xL of the second winding wire 12 and the inductance xL of the fourth winding wire are set to satisfy the above-described appropriate conditions, so even if the parasitic capacitors C10 and C20 are formed in the first winding wire 11 and the third winding wire 13, thereby a self-resonant point is produced, the self-resonant point can be moved to a higher frequency side. Thereby, the influence of the parasitic capacitors C10 and C20 can be equivalently reduced, and a favorable attenuation characteristic can be obtained.

In the noise suppressor, as in the case of the circuit according to the first embodiment, when the value of the inductance xL of the second winding wire 12 and the value of the inductance xL of the fourth winding wire are adjusted, the self-resonant point of the first winding wire 11 and the third winding wire 13 can be moved to a higher frequency side. Moreover, when magnetic coupling between the first winding wire 11 and the second winding wire 12 and magnetic coupling between the third winding wire 13 and the fourth winding wire 14 are strong, the movement effect is further improved.

Thus, in the noise suppressor according to the embodiment, the second winding wire 12 is magnetically coupled to eth first winding wire 11 disposed on the first current-carrying wire 3, and the fourth winding wire 14 is magnetically coupled to the third winding wire 13 disposed on the second current-carrying wire 4, and the inductance xL of the second winding wire 12 and the inductance xL of the fourth winding wire 14 are set to satisfy appropriate conditions, so even if the parasitic capacitors C10 and C20 are formed in the first and the third winding wires 11 an 13 on the current-carrying wires, thereby a self-resonant point is produced, the self-resonant point can be moved to a higher frequency side, and the influence of the parasitic capacitors can be equivalently reduced. Thereby, degradation in the attenuation characteristic by the parasitic component can be prevented so as to obtain a favorable attenuation characteristic.

In particular, in the embodiment, the first and the second winding wires 11 and 12 and the third and the fourth winding wires 13 and 14 are magnetically coupled to each other via the common core 10, so each winding wire can be magnetically coupled to the other winding wire through the use of a simple structure, and size reduction can be easily made.

Modification of Third Embodiment

Figure 17:
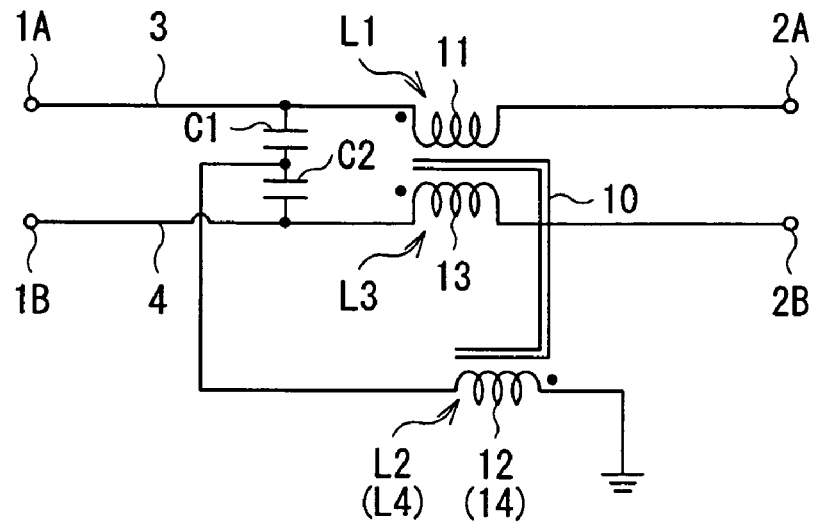
FIG. 17 is a circuit diagram showing a modification of the noise suppressor according to the third embodiment of the invention.

FIG. 17 shows a noise suppressor according to a modification of the embodiment. In the noise suppressor, compared to the circuit structure shown in FIG. 14, the relationship between the connecting positions of the winding wires 12 and 14 and the capacitors C 1 and C2 in the first and the second series circuits 5-1 and 5-2 are opposite, and the winding wires 12 and 14 are combined to form a single winding wire.

In other words, in the noise suppressor, one end of the first capacitor C1 is connected to the first current-carrying wire 3, and one end of the second capacitor C2 is connected to the second current-carrying wire 4, and the second winding wire 12 and the fourth winding wire 14 are combined (hereinafter a winding wire formed through combining the winding wires 12 and 14 is called second winding wire 12). One end of the second combined winding wire 12 is connected to the other end of each capacitor, and the other end of the second winding wire 12 is connected to ground. Moreover, the second combined winding wire 12 is magnetically coupled directly to the first winding wire 11 and the third winding wire 13 via the common core 10. Thereby, in the state where the second winding wire 12 is shared between the first capacitor C1 and the second capacitor C2, the first capacitor C1 and the second capacitor C2 form the first and the second series circuits 5-1 and 5-2, respectively.

In the modification, the second winding wire 12 and the fourth winding wire 14 are combined, so compared to the case where the second winding wire 12 and the fourth winding wire 14 are separately disposed, a simple structure can be achieved, and size reduction can be easily made.

Fourth Embodiment

Next, a noise suppressor according to a fourth embodiment of the invention will be described below.

The noise suppressor according to the third embodiment satisfies one condition that the inductance xL of the whole second winding wire 12 is equal to or smaller than the inductance LL1 per turn in the first winding wire 11 (xL≦LL1). Likewise, the noise suppressor according to the third embodiment satisfies one condition that the inductance xL of the whole fourth winding wire 14 is equal to or smaller than the inductance LL1 per turn in the third winding wire 13. Moreover, magnetic coupling between the first winding wire 11 and the second winding wire 12 is preferably strong (ideally the coupling coefficient k1≈1). Likewise, magnetic coupling between the third winding wire 13 and the fourth winding wire 14 is preferably strong (ideally the coupling coefficient k2≈1). However, in the case of the structure in which the winding wires are magnetically coupled directly to one another via the common core 10, it is difficult to satisfy the condition of xL≦LL1 and for the inductance xL to be smaller than the inductance LL1 per turn, while magnetic coupling between the winding wires is kept strong.

Therefore, in the embodiment, a circuit which can easily achieve a condition for high coupling while satisfying an appropriate condition for the inductance xL of the second and the fourth winding wires 12 and 14 is provided. Herein, the circuit structure corresponding to a circuit in which the second and the fourth winding wires 12 and 14 are combined (refer to FIG. 17) will be described as an example.

Figure 18:
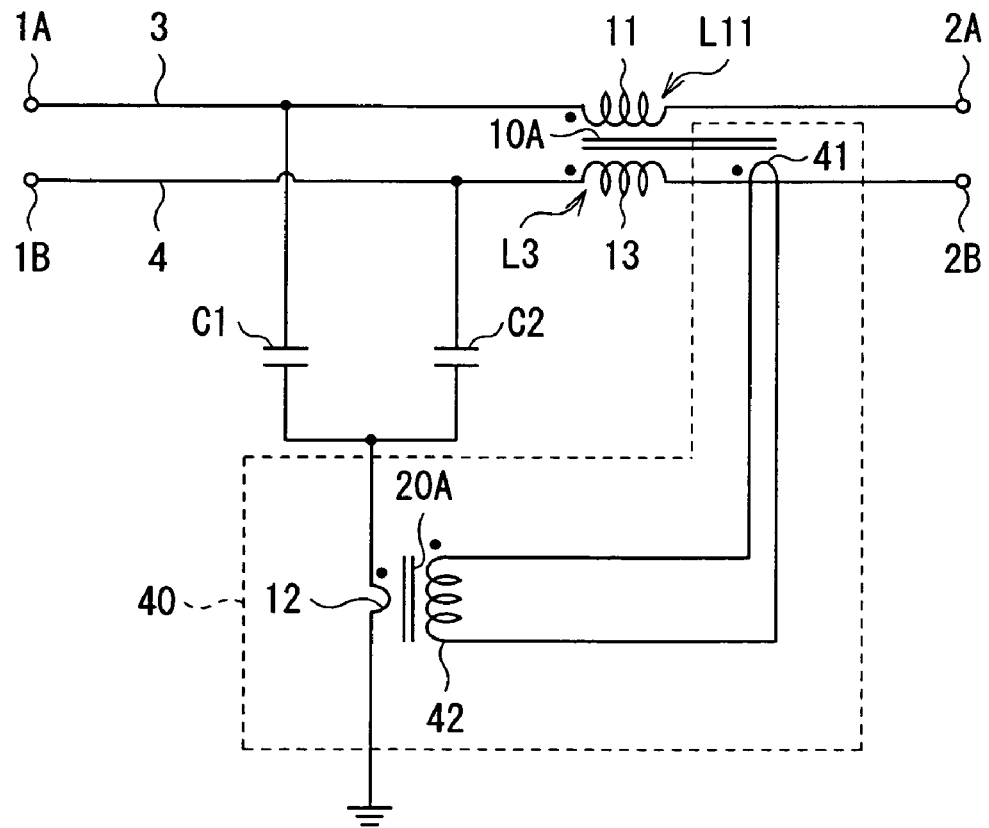
FIG. 18 is a circuit diagram showing an example of a noise suppressor according to a fourth embodiment of the invention.

FIG. 18 shows an example of the noise suppressor according to the embodiment. The embodiment relates to a circuit for common mode noise prevention as in the case of the third embodiment. In the embodiment, like components are denoted by like numerals as of the noise suppressor according to the third embodiment and will not be further described.

In the noise suppressor, compared to the noise suppressor shown in FIG. 17, the structure of a circuit 40, that is, a coupling portion between the first and the third winding wires 11 and 13 and the second winding wire 12 is different. The circuit 40 which is the coupling portion is the same circuit described in the second embodiment (refer to FIG. 11). The noise suppressor includes two cores 10A and 20A instead of the core 10 around which the second winding wire 12 and the first and the third winding wires 11 and 13 are commonly wound. The noise suppressor further includes the first coupling winding wire 41 and the second coupling winding wire 42. The first and the third winding wires 11 and 13 are wound on the primary side and the secondary side of the first core 10A. The first coupling winding wire 41 is wound on the secondary side of the first core 10A. The second coupling winding wire 42 is wound on the primary side of the second core 20A, and the second winding wire 12 is wound on the secondary side of the second core 20A. The first coupling winding wire 41 and the second coupling winding wire 42 are connected to each other. Thereby, the second winding wire 12 and the first and the third winding wires 11 and 13 are magnetically coupled to each other via the first and the second coupling winding wires 41 and 42 equivalently.

In the noise suppressor, the first and the third winding wires 11 and 13 and the second winding wire 12 are wound around the first core 10A and the second core 20A, respectively so that the first and the third winding wires 11 and 13 and the second winding wire 12 are magnetically coupled to each other via the first and the second coupling winding wires 41 and 42 equivalently, so while magnetic coupling between the first and the third winding wires 11 and 13 and the second winding wire 12 is equivalently kept strong, the inductance xL of the whole second winding wire 12 can be easily reduced. For example, in the case where the magnetic permeability of the first core 10A is μ1, and the magnetic permeability of the second core 20A is μ2, when μ1>μ2 is satisfied, and the shape and the number of turns are appropriately set, the inductance of the second winding wire 12 can be smaller than those of the first and the third winding wires 11 and 13. Moreover, the first and the third winding wires 11 and 13 and the second winding wire 12 may be made of different materials.

The conditions of the circuit 40 which is the coupling portion are the same as those described in the second embodiment referring to FIGS. 13A and 13B.

Figure 19:
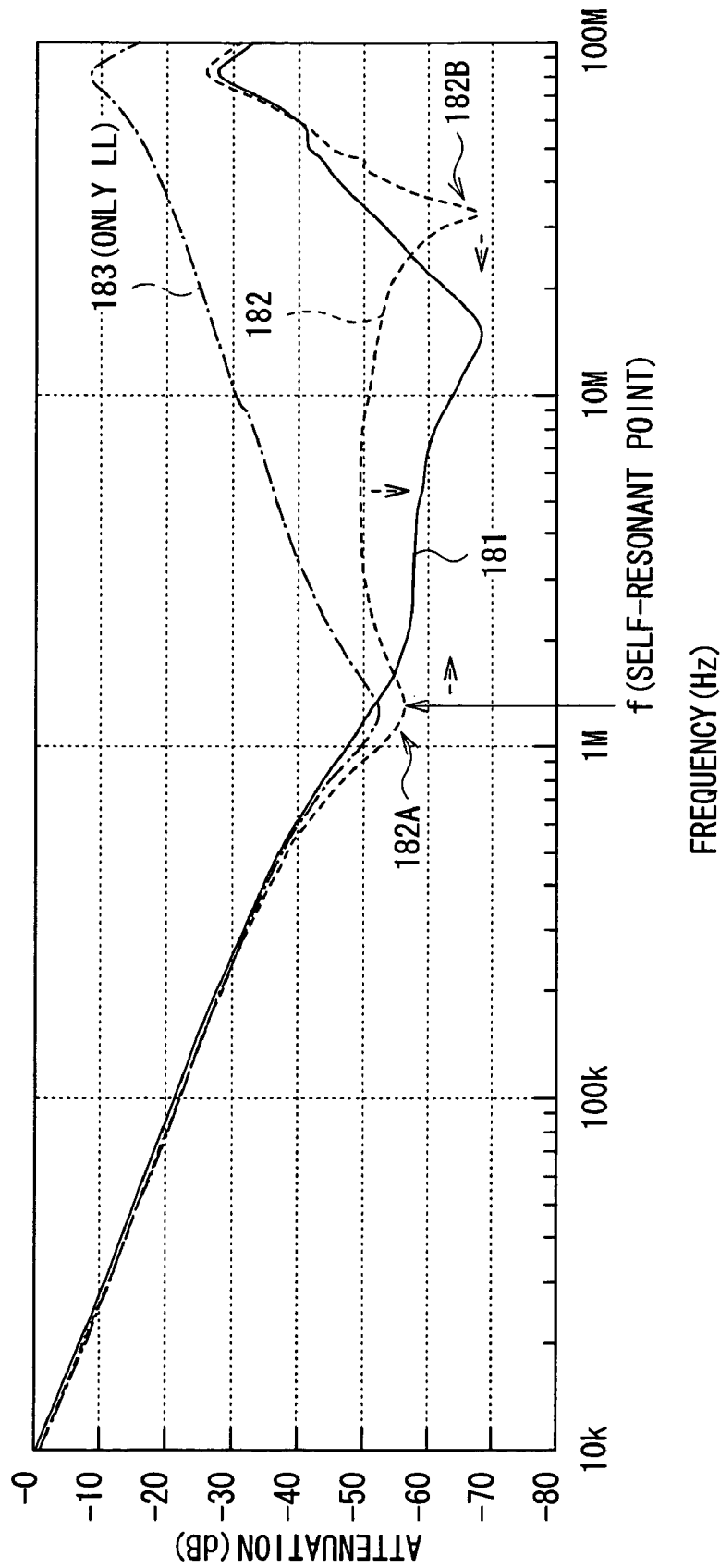
FIG. 19 is a plot showing an attenuation characteristic in the noise suppressor according to the fourth embodiment of the invention.

FIG. 19 shows a plot of the attenuation characteristic of the circuit by actual measurement. The circuit conditions are as follows. The inductance xL is sufficiently smaller than inductances LL of the first and the third winding wires 11 and 13 so as to satisfy the above-described condition. The horizontal axis indicates frequency (Hz), and the vertical axis indicates attenuation (dB). A curve with a numeral 181 shows the attenuation characteristic of the circuit. For comparison, the characteristic of the LC type filter circuit in the related art (corresponding to the structure of FIG. 21) is shown by a curve with a numeral 182. Moreover, the characteristic of a circuit including only a common mode choke coil which includes the first and the third winding wires 11 and 13 is shown by a curve with a numeral 183.

Circuit conditions
Input/output impedance=50Ω
Inductances LL of first and third winding wires 11 and 13=2.5 mH (29 turns)
Capacitances dC of capacitors C1 and C2=1000 pF
Inductance of first coupling winding wire 41=3 μH (one turn)
Inductance xL of second winding wire 12=50 nH (one turn)
Inductance of second coupling winding wire 42=18 turns It is obvious from the plot of FIG. 19 that in the noise suppressor, compared to the circuit including only the common mode choke coil, a favorable attenuation characteristic can be obtained on a high frequency side as a whole. Moreover, compared to the LC type filter circuit in the related art, the self-resonant point 182A by the first and the third winding wires 11 and 13 is moved to a higher frequency side, and the self-resonant point 182B of the capacitors C1 and C2 is moved to a lower frequency side. Further, a favorable attenuation characteristic is obtained in a range between the self-resonant points 182A and 182B.

In a circuit in which the second winding wire 12 and the fourth winding wire 14 are separately disposed (refer to FIG. 14), the same coupling circuit 40 can be used.

Thus, in the noise suppressor according to the embodiment, the first and the third winding wires 11 and 13 and the second winding wire 12 are wound around the first core 10A and the second core 20A, respectively so that the first and the third winding wires 11 and 13 and the second winding wire 12 are magnetically coupled to each other via the first and the second coupling winding wires for coupling 41 and 42 equivalently, so while magnetic coupling between the first and the third winding wires 11 and 13 and the second winding wire 12 is equivalently in a high coupling state, the inductance xL of the whole second winding wire 12 can be easily reduced to be smaller than the inductance LL1 per turn in the first and the third winding wires 11 and 13.

Obviously many modifications and variations of the present invention are possible in the light of the above teachings. It is therefore to be understood that within the scope of the appended claims the invention may be practiced otherwise than as specifically described.

What is claimed is:

1. A noise suppressor comprising:
   a first winding wire being disposed on a first current-carrying wire;
   a series circuit including a capacitor and a second winding wire which are connected to each other in series, the series circuit having one end connected to the first current-carrying wire and the other end connected to a second current-carrying wire; and
   a core around which the first winding wire and the second winding wire are commonly wound,
   wherein the first winding wire and the second winding wire are magnetically coupled directly to each other via the core, and the inductance of the whole second winding wire is set to be smaller than the inductance of the whole first winding wire,
   the first winding wire and the a parasitic capacitor of the first winding wire equivalently form a parallel resonant circuit, and the second winding wire and the capacitor in the series circuit and a parasitic inductor of the capacitor equivalently form a series resonant circuit,
   fh>f is satisfied, where the coupling coefficient between the first winding wire and the second winding wire is k1, the resonant frequency by the capacitor and the parasitic inductor in the series resonant circuit in the case of k1=0 is fh, and the resonant frequency of the parallel resonant circuit in the case of k1=0 is f, and
   fhm≧fm is satisfied, where the resonant frequency of the whole series resonant circuit in the case where the first winding wire and the second winding wire are magnetically coupled to each other is fhm, and the resonant frequency of the parallel resonant circuit in the case where the first winding wire and the second winding wire are magnetically coupled to each other is fm.

2. The noise suppressor according to claim 1, wherein the inductance of the whole second winding wire is equal to or smaller than the inductance per turn in the first winding wire.

3. A noise suppressor comprising:
   a first winding wire being disposed on a first current-carrying wire;
   a series circuit including a capacitor and a second winding wire which are connected to each other in series, the series circuit having one end connected to the first current-carrying wire and the other end connected to a second current-carrying wire;
   a first core around which the first winding wire is wound;
   a first coupling winding wire wound on a secondary side of the first core;
   a second core around which the second winding wire is wound on a secondary side; and
   a second coupling winding wire which is connected to the first coupling winding wire and is wound on a primary side of the second core,
   wherein the first winding wire and the second winding wire are magnetically coupled to each other via the first and the second coupling winding wires equivalently, and the inductance of the whole second winding wire is set to be smaller than the inductance of the whole first winding wire,
   the inductance of the whole second winding wire is equal to or smaller than the inductance per turn in the first winding wire
   the first winding wire and a parasitic capacitor of the first winding wire equivalently form a parallel resonant circuit, and the second winding wire and the capacitor in the series circuit and a parasitic inductor of the capacitor equivalently form a series resonant circuit,
   fh>f is satisfied, where the coupling coefficient between the first winding wire and the second winding wire is k1, the resonant frequency by the capacitor and the parasitic inductor in the series resonant circuit in the case of k1=0 is fh, and the resonant frequency of the parallel resonant circuit in the case of k1=0 is f, and
   fhm≧fm is satisfied, where the resonant frequency of the whole series resonant circuit in the case where the first winding wire and the second winding wire are magnetically coupled to each other, and the resonant frequency of the parallel resonant circuit in the case where the first winding wire and the second winding wire are magnetically coupled to each other is fm.

4. The noise suppressor according to claim 3, wherein $\mu 1 > \mu 2$ is satisfied, where the magnetic permeability of the first core is $\mu 1$, and the magnetic permeability of the second core is $\mu 2$.

5. A noise suppressor comprising:
   a first winding wire being disposed on a first current-carrying wire;
   a first series circuit including a first capacitor and a second winding wire which are connected to each other in series, the first series circuit having one end connected to the first current-carrying wire and the other end connected to ground;
   a third winding wire being disposed on a second current-carrying wire, and being magnetically coupled to the first winding wire; and
   a second series circuit including a second capacitor and a fourth winding wire which are connected to each other in series, the second series circuit having one end connected to the second current-carrying wire and the other end connected to ground,
   wherein the first winding wire and the second winding wire are magnetically coupled to each other, and the third winding wire and the fourth winding wire are magnetically coupled to each other, and the inductance of the whole second winding wire is set to be smaller than the inductance of the whole first winding wire, and the inductance of the whole fourth winding wire is set to be smaller than the inductance of the whole third winding wire,
   the inductance of the whole second winding wire is equal to or smaller than the inductance per turn in the first winding wire,
   the inductance of the whole fourth winding wire is equal to or smaller than the inductance per turn in the third winding wire,
   the first winding wire and a parasitic capacitor of the first winding wire equivalently form a first parallel resonant circuit, and the second winding wire, the first capacitor and a parasitic inductor of the first capacitor equivalently form a first series resonant circuit,
   the third winding wire and a parasitic capacitor of the third winding wire equivalently form a second parallel resonant circuit, and the fourth winding wire, the second capacitor and a parasitic inductor of the second capacitor equivalently form a second series resonant circuit, fh>f is satisfied, where the coupling coefficient between the first winding wire and the second winding wire is k1, the coupling coefficient between the third winding wire and the fourth winding wire is k2, the resonant frequency by the first capacitor and the parasitic inductor in the first series resonant circuit in the case of k1, k2=0 is fh, the resonant frequency of the first parallel resonant circuit in the case of k1, k2=0 is f, the resonant frequency by the second capacitor and the parasitic inductor in the second series resonant circuit in the case of k1, k2=0 is also fh, and the resonant frequency of the second parallel resonant circuit in the case of k1, k2=0 is also f, and fhm≧fm is satisfied, where the resonant frequency of the whole first series resonant circuit in the case where the first winding wire and the second winding wire are magnetically coupled to each other is fhm, the resonant frequency of the first parallel resonant circuit in the case where the first winding wire and the second winding wire are magnetically coupled to each other is fm, the resonant frequency of the whole second series resonant circuit in the case where the third winding wire and the fourth winding wire are magnetically coupled to each other is also fhm, and the resonant frequency of the second parallel resonant circuit in the case where the third winding wire and the fourth winding wire are magnetically coupled to each other is also fm.

6. The noise suppressor according to claim 5, wherein one end of the first capacitor of the first series circuit is connected to the first current-carrying wire, and one end of the second capacitor of the second series circuit is connected to the second current-carrying wire, the second winding wire of the first series circuit and the fourth winding wire of the second series circuit are combined to form a combined winding wire, and one end of the combined winding wire is connected to the other end of the first capacitor of the first series circuit and the other end of the second capacitor of the second series circuit, and the other end of the combined winding wire is connected to ground, and the combined winding wire is magnetically coupled to the first winding wire and the third winding wire.

7. The noise suppressor according to claim 6, further comprising:

a core around which the combined winding wire, the first winding wire and the third winding wire are commonly wound, wherein the winding wires are magnetically coupled directly to one another via the common core.

8. A noise suppressor comprising:

a first winding wire being disposed on a first current-carrying wire;

a first capacitor having one end connected to the first current-carrying wire;

a second winding wire having one end connected to the other end of the first capacitor, and the other end connected to ground, the second winding wire forming a first series circuit together with the first capacitor;

a third winding wire being disposed on a second current-carrying wire, and being magnetically coupled to the first winding wire;

a second capacitor having one end connected to the second current-carrying wire and the other end connected to one end of the second winding wire, the second capacitor forming a second series circuit together with the second winding wire;

a first core around which the first winding wire and the third winding wire are commonly wound;

a first coupling winding wire commonly wound around the first core together with the first winding wire and the third winding wire;

a second core around which the second winding wire is wound on a secondary side; and a second coupling winding wire being connected to the first coupling winding wire, and being wound on a primary side of the second core, wherein the second winding wire, the first winding wire and the third winding wire are magnetically coupled to one another via the first and the second coupling winding wires equivalently, and the inductance of the whole second winding wire is set to be smaller than the inductances of the whole first winding wire and the whole third winding wire, the inductance of the whole second winding wire is equal to or smaller than the inductance per turn in the first winding wire and the inductance per turn in the third winding wire, the first winding wire and a parasitic capacitor of the first winding wire equivalently form a first parallel resonant circuit, and the second winding wire and the first capacitor which form the first series circuit, and a parasitic inductor of the first capacitor equivalently form a first series resonant circuit, the third winding wire and a parasitic capacitor of the third winding wire equivalently form a second parallel resonant circuit, and the second winding wire and the second capacitor which form the second series circuit, and a parasitic inductor of the second capacitor equivalently form a second series resonant circuit, fh>f is satisfied, where the coupling coefficient between the first winding wire and the second winding wire is k1, the coupling coefficient between the third winding wire and the second winding wire is k2, the resonant frequency by the first capacitor and the parasitic inductor in the first series resonant circuit in the case of k1, k2=0 is fh, the resonant frequency of the first parallel resonant circuit in the case of k1, k2=0 is f, the resonant frequency by the second capacitor and the parasitic inductor in the second series resonant circuit in the case of k1, k2=0 is also fh, and the resonant frequency of the second parallel resonant circuit in the case of k1, k2=0 is also f, and fhm≧fm is satisfied, where the resonant frequency of the whole first series resonant circuit in the case where the first winding wire and the second winding wire are magnetically coupled to each other is fhm, the resonant frequency of the first parallel resonant circuit in the case where the first winding wire and the second winding wire are magnetically coupled to each other is fm, the resonant frequency of the whole second series resonant circuit in the case where the third winding wire and the second winding wire are magnetically coupled to each other is also fhm, and the resonant frequency of the second parallel resonant circuit in the case where the third winding wire and the second winding wire are magnetically coupled to each other is also fm.

9. The noise suppressor according to claim 8, wherein $\mu_1 > \mu_2$ is satisfied, where the magnetic permeability of the first core is $\mu_1$, and the magnetic permeability of the second core is $\mu_2$.

* * * * *